US009954132B2

(12) United States Patent
Shahar et al.

(10) Patent No.: US 9,954,132 B2
(45) Date of Patent: Apr. 24, 2018

(54) SYSTEMS AND METHODS FOR DETECTORS HAVING IMPROVED INTERNAL ELECTRICAL FIELDS

(71) Applicant: General Electric Company, Schenectady, NY (US)

(72) Inventors: Arie Shahar, Moshav Magshimim (IL); Yaron Glazer, Rehovot (IL); Jeffrey Levy, Tel Aviv (IL); Avishai Ofan, Modiin (IL); Rotem Har-Lavan, Nes Harim (IL)

(73) Assignee: General Electric Company, Schenectady, NY (US)

(*) Notice: Subject to any disclaimer, the term of this patent is extended or adjusted under 35 U.S.C. 154(b) by 65 days.

(21) Appl. No.: 14/526,796

(22) Filed: Oct. 29, 2014

(65) Prior Publication Data

US 2016/0126402 A1    May 5, 2016

(51) Int. Cl.
| | | |
|---|---|---|
| *H01L 31/08* | (2006.01) | |
| *G01T 1/24* | (2006.01) | |
| *H01L 31/0296* | (2006.01) | |
| *H01L 31/0224* | (2006.01) | |
| *H01L 31/18* | (2006.01) | |

(52) U.S. Cl.
CPC ............ *H01L 31/085* (2013.01); *G01T 1/24* (2013.01); *G01T 1/249* (2013.01); *H01L 31/0296* (2013.01); *H01L 31/02966* (2013.01); *H01L 31/022408* (2013.01); *H01L 31/1828* (2013.01);
(Continued)

(58) Field of Classification Search
CPC ............... H01L 31/085; H01L 31/0296; H01L 31/1864; H01L 31/022408; H01L 31/1828; H01L 31/1832; H01L 31/02966; G01T 1/24; G01T 1/249
See application file for complete search history.

(56) References Cited

U.S. PATENT DOCUMENTS 5,164,809 A * 11/1992 Street .................. H01L 27/148
                                                    250/370.01
5,905,772 A    5/1999 Rutten et al.
(Continued)

FOREIGN PATENT DOCUMENTS

| WO | 2012154334 A1 | 11/2012 |
|---|---|---|
| WO | 2014030094 A1 | 2/2014 |

OTHER PUBLICATIONS

International Search Report and Written Opinion from corresponding PCT application No. PCT/US2015/052687 dated Nov. 20, 2015; 13 pages.

*Primary Examiner* — Shaun Campbell
*Assistant Examiner* — Aneta Cieslewicz
(74) *Attorney, Agent, or Firm* — Dean D. Small; The Small Patent Law Group, LLC

(57) ABSTRACT

A radiation detector is provided including a cathode, an anode, and a semiconductor wafer. The semiconductor wafer has opposed first and second surfaces. The cathode is mounted to the first surface, and the anode is mounted to the second surface. The semiconductor wafer is configured to be biased by a voltage between the cathode and the anode to generate an electrical field in the semiconductor wafer and to generate electrical signals responsive to absorbed radiation. The electrical field has an intensity having at least one local maximum disposed proximate to a corresponding at least one of the first surface or second surface.

15 Claims, 13 Drawing Sheets

(52) U.S. Cl.
CPC ...... *H01L 31/1832* (2013.01); *H01L 31/1864* (2013.01)

(56) References Cited

U.S. PATENT DOCUMENTS

| | | |
|---|---|---|
| 6,268,614 B1 | 7/2001 | Imai |
| 6,373,064 B1 | 4/2002 | Yao et al. |
| 7,525,098 B2 | 4/2009 | El-Hanany et al. |
| 7,528,377 B2 | 5/2009 | El-Hanany et al. |
| 7,692,258 B2 | 4/2010 | Reshotko et al. |
| 7,800,071 B2 | 9/2010 | Shahar et al. |
| 2006/0258105 A1 | 11/2006 | Zundel et al. |
| 2007/0012242 A1 | 1/2007 | Jurisch et al. |
| 2009/0065701 A1* | 3/2009 | Bale .......... G01T 1/24 250/370.09 |
| 2009/0267200 A1 | 10/2009 | Gutt et al. |
| 2010/0327313 A1 | 12/2010 | Nakamura |
| 2013/0193336 A1 | 8/2013 | Washington, II et al. |
| 2013/0256541 A1* | 10/2013 | Engel .......... G01T 1/24 250/370.01 |
| 2014/0048714 A1 | 2/2014 | Shahar et al. |

\* cited by examiner

SYSTEMS AND METHODS FOR DETECTORS HAVING IMPROVED INTERNAL ELECTRICAL FIELDS

BACKGROUND OF THE INVENTION

The subject matter disclosed herein relates generally to apparatus and methods for semiconductor radiation detectors.

Radiation detectors may be used for ionizing radiation, such as Gamma Ray and X-Ray radiation. For example, radiation detectors made of Cadmium Telluride (CdTe) or Cadmium Zinc Telluride (CdZnTe or CZT) may be employed as detectors for medical imaging, including in nuclear medicine imaging applications. Radiation detectors may be employed in a wide variety of fields, for example, in connection with gamma cameras, single photon emission computed tomography (SPECT), positron emission tomography (PET), computed tomography (CT), space telescopes, or homeland security applications.

In direct conversion detectors, such as semiconductor radiation detectors, detected photons of ionizing radiation are absorbed in the detector bulk. Each of the absorbed photons creates, in the absorption location of the photon in the detector bulk, an electric charge consisting of multiple electron-hole pairs. A high voltage bias is applied across the detector bulk between the positively biased anodes and the negatively biased cathode. The negatively charged electrons are drifted toward the positively biased anodes and move toward the anodes as a group that may be referred to as an electron cloud. Similarly, but in the opposite direction, the positively charged holes are drifted toward the negatively biased cathode and move toward the cathode as a group that may be referred to as a hole cloud.

When the electron cloud (which has a total electrical charge expressed as (−q)) drifts toward the anode, a "mirror" electrical charge $Q_e$ is induced on the anodes. In the absence of small-pixel effect, $Q_e$ is proportional to the drift distance X of the electron cloud from the absorption location of the photon in the detector bulk to the anode. The electrical charge Qe may be given by:

$$Q_e = q_0(t) \cdot \frac{x}{D} \cdot e^{-t_e/\tau_e} \quad \text{Eq. (1)}$$

In Equation 1, $q_0$ is the initial charge of the electron cloud produced by the absorption of the photon in the detector bulk at a distance X from the anodes, D is the detector thickness measured from the cathode to the anode, $t_e$ is the drift time of the electron cloud from the absorption point of the photon (where the electrons-cloud is created) to the anodes, and $\tau_e$ is the lifetime of the electrons before they are recombined with holes or trapped by traps in a forbidden band-gap.

Similarly, for the same case described above, the hole cloud has a total electrical charge (+q) that drifts toward the cathode and induces a "mirror" electrical charge $Q_h$ on the anode. In the absence of small-pixel effect, $Q_h$ is proportional to the drift distance (D-X) of the hole cloud from the absorption location of the photon in the detector bulk to the cathode. The electrical charge $Q_h$ is given by:

$$Q_h = q_0(t) \cdot \frac{(D-x)}{D} \cdot e^{-t_h/\tau_h} \quad \text{Eq. (2)}$$

In Equation 2, $t_h$ is the drift time of the hole cloud from the absorption point of the photon (where the hole cloud is created) to the cathode, and $\tau_h$ is the lifetime of the holes before they are recombined with electrons or trapped by traps in the forbidden band-gap.

The electrons and the holes are charged negatively and positively, respectively, and drift in opposite directions. Thus, the charges $Q_e$ and $Q_h$ that are induced on the anode have the same polarity. The charges $Q_e$ and $Q_h$ may be added to give a total induced electrical-charge $Q_T$ that is given by:

$$Q_T = q_0 \cdot \frac{x}{D} \cdot e^{-t_e/\tau_e} + q_0 \cdot \frac{(D-x)}{D} \cdot e^{-t_h/\tau_h} \quad \text{Eq. (3)}$$

In the case that the lifetimes of the electrons and the holes $\tau_e$ and $\tau_h$ are significantly longer than the drift times of electrons and the holes $t_e$ and $t_h$ to the anode and the cathode, respectively, then the electrons and the holes may reach the anode and the cathode without being recombined. In such a case, where $\tau_e$ and $\tau_h \gg t_e$ and $t_h$, equation (3) may be expressed as:

$$Q_T = q_0 \cdot \frac{X}{D} + q_0 \cdot \frac{(D-X)}{D} = q_0 \quad \text{Eq. (3a)}$$

In the case expressed by equation (3a), where $Q_T = q_0$, if the electron cloud and the hole cloud are drifted all along their respective distances to the anode and the cathode, respectively, without charge-recombination loss, then there is a complete charge collection. In the event of complete charge collection, the total charge $Q_T$ induced on the anode is fixed, does not depend on the absorption depth (location) X in the detector bulk, and is equal to the initial electrical-charge $q_0$ of the electron cloud or the hole cloud.

However, with CdTe and CZT detectors, the drift time of the hole cloud to the cathode, due to low mobility, may be much longer than the lifetime of the holes, i.e. $t_h \gg \tau_h$. In such a case, as can be seen from equation (3), most of the holes in the hole cloud are recombined prior to arrival to the cathode, and thus do not contribute to the total charge $Q_T$ induced on the anode.

In such a case, the high mobility of the electrons may result in a drift time of the electron cloud to the anodes that is much shorter than the lifetime of the electrons, i.e. $t_e \ll \tau_e$. As can be seen from equation (3), in such a case, most of the electrons in the electron cloud arrive to the anode and most of the electrons contribute to the total charge $Q_T$ induced on the anode by a complete charge collection process.

In such a case, the electron cloud is almost the only contributor to the total charge $Q_T$ induced on the anode, and. under the conditions $t_h \gg \tau_h$ and $t_e \ll \tau_e$ equation (3) may be expressed as:

$$Q_T = q_0 \cdot \frac{X}{D} \quad \text{Eq. (4)}$$

In such a case, the charge induced on the anode depends on the absorption location X of the photon in the detector bulk, also known as Depth-Of-Interaction (DOI). The dependency of the charge induced at the anode on the DOI causes the electrical signal at the anode to vary according to the DOI, X. The dependency of the charge on the DOI creates what may be referred to as low energy tail in the detector spectrum, which significantly reduces the detector efficiency as used for imaging when only a relative narrow energy window is used around the energy peak (events with complete charge collection) of the detector spectrum. The detector efficiency, as used herein, may be defined as the ratio between the number of photons detected in an energy window around the energy-peak of the detector-spectrum and the total number of photons detected in the detector-spectrum.

To overcome the problem of the anode signals in photon counting detectors being dependent of the depth-of-interaction (DOI) of the counted photons in the detector bulk, various solutions have been attempted in the past, including the small-pixels effect solution, and the very high voltage solution.

In the small-pixels effect solution, a configuration including small anodes configuration is used to produce what is known as the "small-pixel effect." It may be noted that the small-pixel effect may become noticeable as the pixel size becomes less than half of detector thickness or smaller. Due to the small anodes, the induced charge on the anodes becomes significant only when the electron cloud moves in the close vicinity of the anodes. This makes the signals induced on the anodes independent of the DOI. The hole cloud that moves far away from the small anodes almost does not contribute to the signal from the anodes. Accordingly, in the existence of small-pixel effect, the signal at the anodes is independent on the DOI.

However, the small anodes may not produce an electrical field that is strong enough to ensure complete charge collection, or sufficient charge collection. Accordingly, a steering grid may be inserted between the small anodes, with the steering grid biased by a voltage that is lower than the voltage of the anodes. In such an arrangement, the steering grid assists the small anodes in creating an electrical field, in the detector bulk, that may be strong enough to ensure complete or near complete charge collection by the small anodes, and, at the same time, the lower voltage of the steering grid allows the electrons to be drifted toward the small anodes without being collected by the steering-grid.

While the small anodes that are combined with a steering-grid provide a configuration in which the signals from the anodes are generally independent of the DOI, such a configuration has a number of drawbacks. For example, such a configuration forces the use of a large amount of small pixels, which complicates the processing of the signals acquired from the large amount of pixels. As another example, the steering-grid requires a High Voltage (HV) bias, which is separated from the HV bias of the anodes. Such an arrangement complicates the fabrication and assembly of the detectors.

Another solution attempted in the past is the very high voltage solution. Under the very high voltage solution, the HV bias applied across the detector bulk between the cathode and the anodes is increased significantly, relative to normal operation conditions, to produce a relatively very high electrical-field in the detector bulk. Using such an approach, under a relatively very high electrical-field even a hole cloud that has generally low mobility may have sufficient drift time to allow the hole cloud to reach the cathode before being recombined and thereby, according to Eq. (3), reduce or eliminate the dependency of the signals of the anodes on the DOI. The very high voltage solution also suffers from a number of drawbacks. For example, increasing the HV increases the leakage current, which may result in degradation of the energy-resolution of the detector. As another example, the use of very high HV may cause voltage breakdown. Even minor voltage breakdown may produce false events in the detection of the detector.

BRIEF DESCRIPTION OF THE INVENTION

In one embodiment, a radiation detector is provided including a cathode, an anode, and a semiconductor wafer. The semiconductor wafer has opposed first and second surfaces. The cathode is mounted to the first surface, and the anode is mounted to the second surface. The semiconductor wafer is configured to be biased by a voltage between the cathode and the anode to generate an electrical field in the semiconductor wafer and to generate electrical signals responsive to absorbed radiation. The electrical field has an intensity having at least one local maximum disposed proximate to a corresponding at least one of the first surface or second surface.

In another embodiment, a method of forming a radiation detector is provided. The method includes providing a semiconductor wafer having a first surface and an opposed second surface. The semiconductor wafer is configured to be biased by a voltage between the first surface and the second surface to generate an electrical field in the semiconductor wafer and to generate electrical signals responsive to absorbed radiation. Also, the method includes annealing the semiconductor wafer, wherein the annealing is controlled such that the electrical field has an intensity having at least one local maximum disposed proximate to a corresponding at least one of the first surface or second surface. Further, the method includes applying a cathode to the first surface and applying an anode to the second surface.

DETAILED DESCRIPTION OF THE INVENTION

Figure 1:
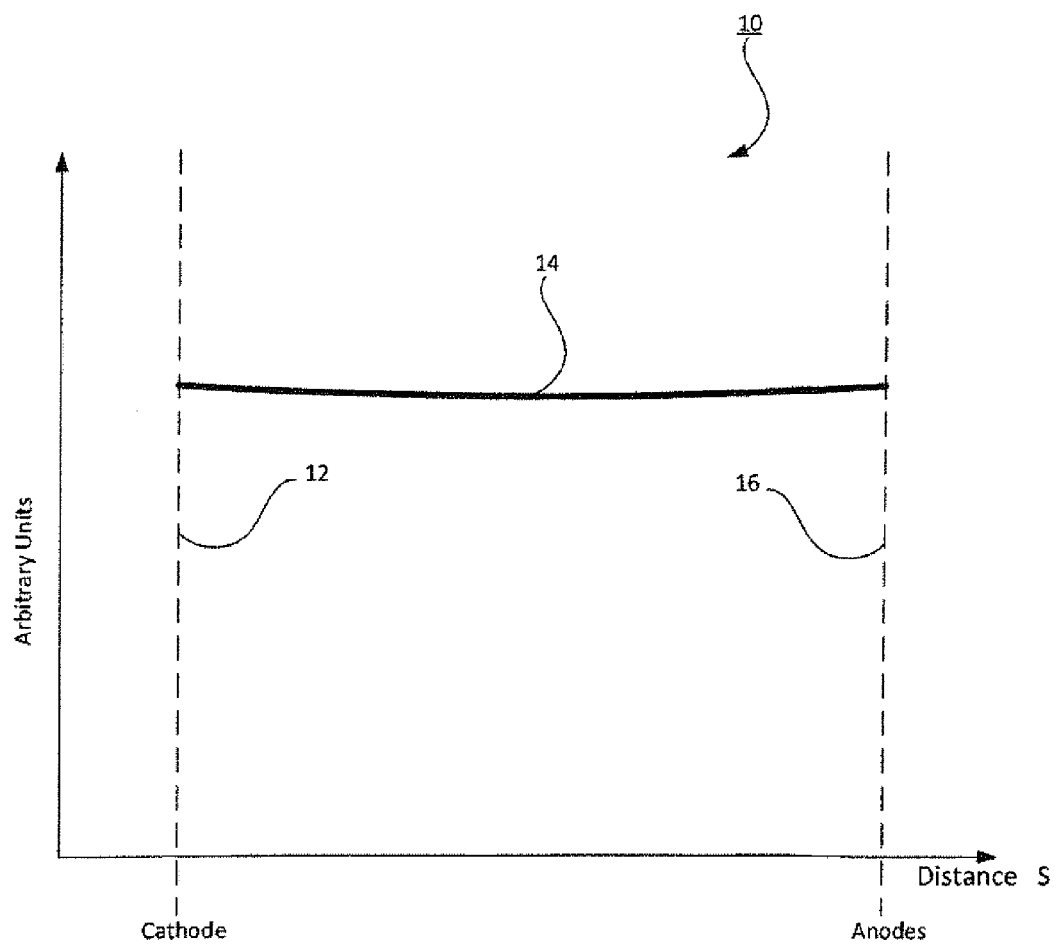
FIG. 1 provides a graph of a uniform and monotonic diffusion-distribution.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. Various modules or units shown in the attached figures may represent the hardware that operates based on software or hardwired instructions, the software that directs hardware to perform the operations, or a combination thereof.

"Systems," "units," or "modules" may include or represent hardware and associated instructions (e.g., software stored on a tangible and non-transitory computer readable storage medium, such as a computer hard drive, ROM, RAM, or the like) that perform one or more operations described herein. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

As used herein, an element or step recited in the singular and preceded with the word "a" or "an" should be understood as not excluding plural of said elements or steps, unless such exclusion is explicitly stated. Furthermore, references to "one embodiment" of are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Various embodiments provide systems and methods for improving the performance of radiation detectors. Various embodiments provide improved sensitivity, for example, of Cadmium Zinc Telluride (CZT) detectors via the configuration of an electrical field generated by a detector. Generally, in various embodiments, the detector may be configured such that the highest intensity of a generated electrical field is in the vicinity of anodes and/or cathodes. For example, such a distribution of a generated electrical field may be provided by annealing layers under the surface to which the anodes and/or cathodes are applied.

In some embodiments, asymmetric annealing layers may be produced. For example, layers in which the annealed layer under the cathode is thinner than the annealed layer under the anode may be provided, resulting in a higher intensity of the electrical field under the anodes, which may in turn result in production of a small-pixel like effect (e.g., the induced charge on the anodes becomes significant only when the electron cloud moves in the close vicinity of the anodes, resulting in signals induced on the anodes independent of the DOI), even if relatively large anodes are used. The combination of the small-pixel like effect with large anodes provides operation with the benefit of the small-pixel like effect (e.g., insensitivity to DOI) along with high collection efficiency for improved sensitivity without the need for a steering-grid. Thus, the sensitivity of the detectors may be improved while maintaining good energy resolution. In asymmetric distributions, a first maximum (e.g., a local maximum located proximate a first surface) may be substantially larger than a second local maximum (e.g., a local maximum located proximate a second surface disposed opposite the first surface). For example, the first local maximum may be 50% larger, 100% larger, 200% larger, or 500% larger than second local maximum in various embodiments, among others. In symmetric distributions the first and second local maxima may be substantially similar to each other, for example within 5% of each other.

A technical effect provided by various embodiments includes increased sensitivity of radiation detectors, such as radiation detectors that may be utilized in conjunction with a NM imaging detector system. A technical effect of various embodiments includes reduction in complexity or expense of processing equipment (e.g., ASICs or other components required for biasing a steering a grid or providing sufficient channels for small anodes) and/or elimination or reduction of voltage breakdown and/or leakage current. A technical effect of various embodiments includes improvement in sensitivity of detectors while allowing for high collection efficiency.

Various embodiments proved for internal electrical-field shapes or configurations of a detector providing improved performance, for example as a radiation detector for single photon counting. One detector fabrication process that affects the shape of the internal electrical field in the detector bulk is the annealing process.

For semiconductor wafers, the annealing process is a process that, for example in the case of CdTe or CZT detectors, corrects and improves the stoichiometry of the detector semiconductor material by heating the detector to a certain temperature T under atmosphere of, for example, Tellurium (Te) or Cadmium (Cd) gas at a certain pressure P for a time duration t. The "as-grown" crystal of the semiconductor material from which the detector is made has slight deviation from ideal or perfect stoichiometry conditions. For example, in the case of CdTe and CZT, the perfect stoichiometry conditions are Cd(50%)Te(50%) and (CdZn)(50%)Te(50%). For example, in the case of CZT, the "as-grown" semiconductor crystal may suffer from slight deviation from the perfect stoichiometry conditions, i.e. (CdZn)

or Te fractions that are different from 50%. This means that the CZT material may have a slight excess of Te or (CdZn).

In CZT, when the semiconductor material from which the detector is made deviates sufficiently from ideal or perfect stoichiometry, the detector may include precipitates and inclusions of Te or Cd, or Cd vacancies. Such precipitates and/or vacancies may cause the material to have relatively low resistivity. The annealing process (or processes) improves the stoichiometry of the material and thus, increases the bulk resistivity of the material (wafer) from which the detector is made by causing the precipitates and inclusions of Te or Cd or Cd vacancies to diffuse from the wafer volume into the wafer surface and/or out of the wafer, and at the same time may cause to Te or Cd gas to diffuse from the wafer surface into the bulk.

Generally, the annealing process is mainly a diffusion process. The effectiveness of annealing and the amount of penetration into and out of the volume of the wafer bulk from which the detector is made depends on the diffusion parameters. Examples of diffusion parameters include the wafer temperature T, the pressure P of the gas (e.g., Te or Cd vapors) in which the wafer is placed, and the time duration t that the annealing process lasts.

Since the annealing process improves the bulk resistivity of the wafer, which is proportional to the amount of annealing in the wafer, it may be noted that the annealing diffusion-profile and the resistivity-profile of the bulk are correlated and similar. Accordingly, the annealing diffusion-profile and resistivity profile may be schematically presented by the same diffusion-profile. The internal electrical field in the detector is proportional to the bulk-resistivity. Accordingly the electrical field can also be presented schematically by the same diffusion-profile.

For certain conventional detectors, special efforts may be made to select the parameters T, P and t that control the diffusion of the annealing process to create deep diffusion into the volume of the wafer in order to produce uniform or near uniform annealing across the entire wafer thickness, resulting in uniform and homogenous resistivity. Such uniform and homogenous resistivity in the detector-bulk helps ensures a uniform internal electrical field across the range of the detector made of the annealed wafer and in between anodes and cathode electrodes applied onto the wafer surfaces.

FIG. 1 provides a graph 10 that schematically illustrates a diffusion-distribution 14 as a function of distance S between cathode 12 and anodes 16 of a radiation detector. The anodes 16 and the cathode 12 contacts of the detector are applied on the same surfaces of the detector from which the diffusion into and out from the wafer takes place during annealing. Diffusion-profile 14 may be understood to schematically represent each the following: the profile of the annealing amount, the resistivity-profile of the wafer from which the detector is made, and the profile of the internal electrical-field produced in between the anodes 16 and the cathode 12 of the detector when a HV bias is applied between the anodes 16 and the cathode 12 of the detector. It may be noted that the diffusion-profile of FIG. 1 is intended to be schematic in nature and provided for illustrative purposes, and is intended to represent general behavior. It may be further noted that, when the diffusion-profile represents annealing amount, resistivity or internal electrical-field, the profile may have the corresponding units of centimeters$^{-3}$, Ohms-centimeters or Volt/centimeters, respectively.

As seen in FIG. 1, the depicted profile 14 is nearly fixed and uniform as a function of the distance S between the cathode 12 and anodes 16. As mentioned above, the profile 14 depicted in FIG. 1 represents the distribution of annealing amount, resistivity, and internal electrical-field that are produced by conventional fabrication-processes for radiation semiconductor-detectors.

Figure 2:
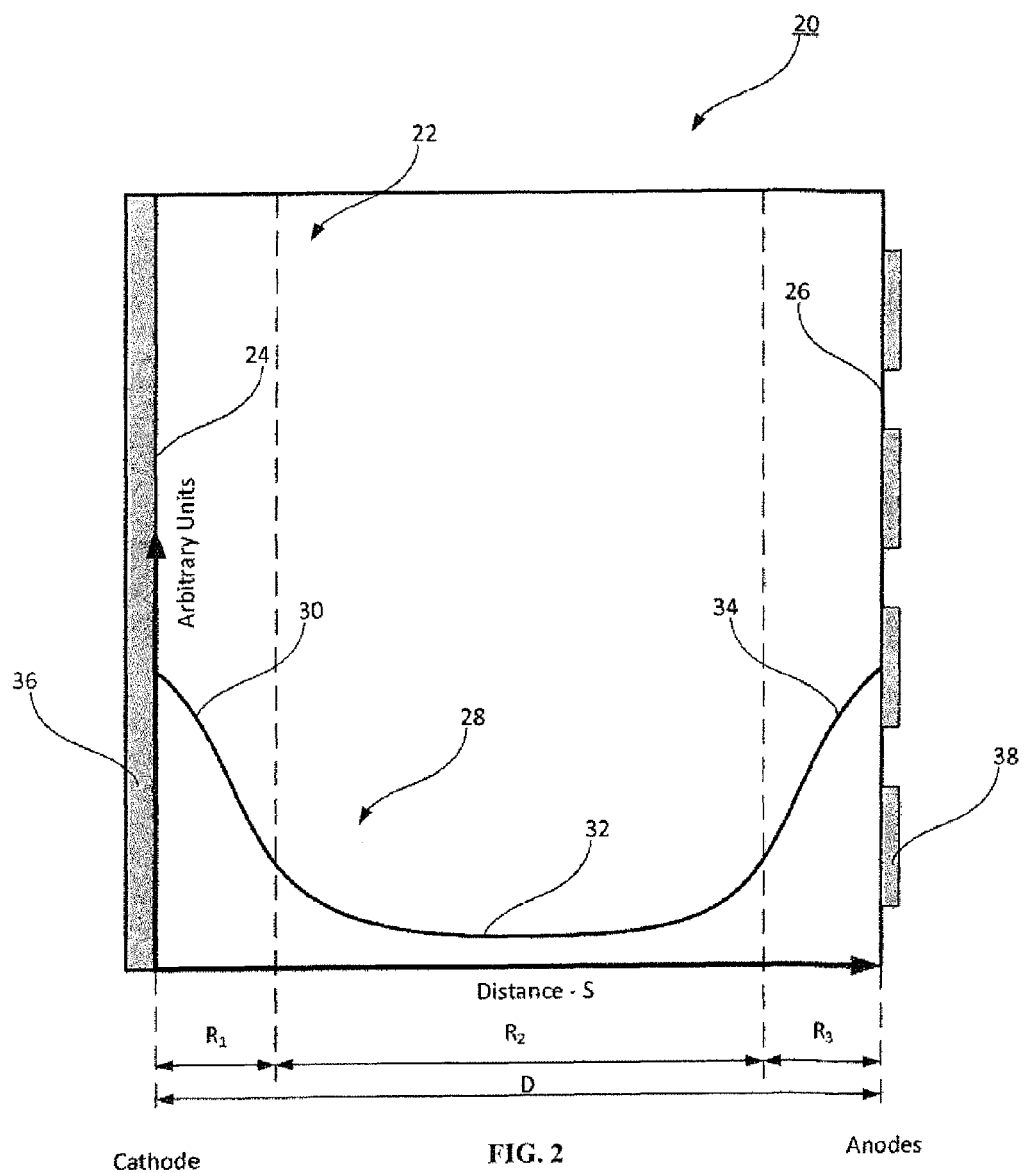
FIG. 2 provides a schematic view of a symmetric diffusion-distribution or distribution-profile as a function of distance between a cathode and anodes of a radiation detector in accordance with various embodiments.

FIG. 2 illustrates distribution-curve or distribution-profile 28 as a function of distance S between cathode 36 and anodes 38 in bulk 22 of a semiconductor detector 20 made in accordance with various embodiments. The detector 20 may be fabricated, for example, from CdTe or CZT materials. As explained above, the distribution-profile 28 may represent one or more of the annealing-distribution, the resistivity-distribution, or the internal electrical field distribution in the bulk 22 of the detector 20. In various embodiments, the shape of distribution-profile 28 may be configured by control of diffusion parameters, such as T, P, and t of the annealing process.

The shape of the distribution-profile 28 may be achieved, for example, by iterative adjustment of the diffusion parameters T, P, and t of the annealing process according to the internal electrical-field distribution, in the detector bulk 22, as measured by Pockels-Cell Method. The Pockels-Cell method is based on the measurement of the polarization rotation of Infra-Red (IR) radiation propagation in the bulk 22 of the semiconductor radiation detector (e.g., CdTe or CZT) 20 as a function of the intensity distribution of the internal electrical field in the detector bulk 22. Thus, in various embodiments, the desired internal electrical-field distribution (e.g., distribution-profile 28) may be achieved, modified, adjusted, and/or shaped using the appropriate conditions for the annealing parameters T, P, and t as derived from the iterative adjustment described above.

As seen in FIG. 2, the distribution 28 of the diffusion-curve (which represents, among others, the internal electrical-field distribution in bulk 22 of the detector 20) has two maxima (or local maxima) in the form of two peaks 30 and 34 in regions $R_1$ and $R_3$, respectively. The region $R_1$ represents the region near or proximate to the cathode, while the region $R_3$ represents the region near or proximate to the anodes. A region $R_2$ represents an intermediate region between $R_1$ and $R_3$. Peaks 30 and 34 are in the vicinity of surfaces 24 and 26, respectively, which are the interfaces between the bulk 22 and the cathode 36, and between the bulk 22 and the anodes 38, respectively. As seen in FIG. 2, the maxima are substantially larger (e.g., have a higher intensity) than the corresponding value over the intermediate region R2. For example, in various embodiments the maxima may have, among others, a value that is twice as large, three times as large, five times as large, or ten times as large as the values for the intermediate region.

For the example embodiment depicted in FIG. 2, the diffusion process starts at the surfaces 24 and 26 (prior to the application of the cathode 36 and the anodes 38 on the bulk 22), and, accordingly, the values of parameters or characteristics that are proportional to the amount of diffusion are strongest proximate the surfaces 24 and 26. The diffusion concentration goes down with the distance from surfaces 24 and 26 and into the bulk 22 according to the diffusion equation (complimentary error-function-erfc), such that only the low tail of the concentration (of the function erfc) exists deep in the volume or interior of the bulk 22. Accordingly, the highest resistivity and the highest internal electrical-fields exist in the forms of the peaks 30 and 34, in distribution curve 28, in the vicinity of surfaces 24 and 26 under the cathode 36 and the anodes 38 in regions $R_1$ and $R_3$, respectively.

It may be noted that the depicted profile 28 is presented for illustrative purposes by normalized arbitrary units. Accordingly, in the case when the profile 28 is normalized and represents, in bulk 22, the electrical-field distribution, the annealing diffusion-distribution, or the resistivity-distribution, the normalized shape is independent of the following: the magnitude of the HV bias applied across the detector, the initial concentration of the component or material that diffuses during the annealing process, and the absolute values of the resistivity, respectively.

The distribution profile 28 of FIG. 2, which has two peaks 34 and 30 (under the anodes 38 and the cathode 36, respectively) is significantly different from the curve 14 of FIG. 1, which is uniform. For example, under the conditions of parameters T and P selected and set for the annealing diffusion-profile of 28 of FIG. 2 but, for annealing duration t that is much longer than the duration time t used for the annealing of the profile 28 of FIG. 2, the curve 14 of FIG. 1 may be formed. Once the curve 14 of FIG. 1 is almost uniform, the curve 14 becomes insensitive to the duration time (e.g., additional time beyond the duration required to render the curve almost uniform) of the annealing. Accordingly, the curve 14 of FIG. 1 is simpler to achieve than the diffusion-profile 28 of FIG. 2, as the annealing process may be conducted for a relatively long time to help ensure uniformity or near-uniformity of the curve 14. On the other hand, to achieve the profile 28 of FIG. 2, more careful or precise adjustment and control of the parameters T, P, and t of the annealing process may be derived and used according to the iterative method mentioned above, for example.

The detector 20 depicted by FIG. 2 having profile 28 has a number of advantages over a detector having a uniform profile as depicted by FIG. 1. For example, radiation received by detector 20 of FIG. 2 may be collected via the cathode 36, with most of the radiation absorbed in region $R_1$ where the internal electrical-field has its local maximum 30. Accordingly, the electron cloud and the hole clouds created in region $R_1$, which constitute most of the charge-carrying clouds created in the detector 20, are close to the cathode 36 and are under the relatively strong internal electrical field as shown by the local maxima 30. Further, both the strong electrical field at region $R_1$ acting on the hole clouds as well as the short distance that these hole clouds travel toward the cathode 36 help ensure that the drift time $t_h$ of these hole clouds, to cathode 36, is sufficiently shorter than the lifetime $\tau_h$ of the holes. In this case, the hole-clouds are collected in the cathode 36 by a complete charge collection process, which makes the holes less sensitive to the DOI. (The DOI, as mentioned previously, represents the location where the photons are absorbed in bulk.)

As another example advantage of the profile 28, due to the high mobility of the electrons, the drift time $t_e$ of the electron clouds toward the anodes 38 satisfies the condition needed for their complete charge collection at the anodes 38, namely, a drift time $t_e$ that is much shorter than the lifetime $\tau_e$ of the electrons. In this case, the electron clouds are collected in the anodes 38 by a complete charge collection process, which makes the electrons less sensitive to the DOI.

As another example advantage of the profile 28, the peak 34 of the electrical-field near the anodes 38 produces an effect similar to the small-pixel effect, even though, with an electrical field having a profile such as profile 28, the anodes 38 need not be small, and no small pixel effect may be produced by the anodes 38 themselves. The strong electrical field (as shown by the peak 34) near the anodes 38 and the sharp gradient induces a charge on the anodes 38, by the moving electron clouds, mainly when the electron clouds move near the anodes 38, similar as to that occurring with the small-pixel effect, and having a corresponding weight function. This produces what may be referred to as a "small-pixel like effect," even though the anodes contacts and the pixels are not necessarily small (e.g., not small enough to produce the small-pixel effect in the absence of a modified distribution such as a distribution having the profile 28), and the small pixel effect may not be produced by the anodes 38 themselves. However, the produced small-pixel effect is similar to the effect produced by small pixels, in that most of the charge induced on the anodes 38, by the electron clouds moving toward the anodes 38, is produced near these anodes 38 due to the high intensity peak of the electrical field there, which also has a sharp gradient.

The high intensity and high gradient of the electrical-field near the anodes 38 in the detector 20 of FIG. 2 is produced by the electrical field having the peak 34 or local maxima near the anodes 38. The location of the peak 34 helps make the detector 20 less sensitive to the DOI. In such a case, the sensitivity to the DOI of the detector 20 of FIG. 2 fabricated or manufactured according to various embodiments is further reduced. This reduction in the sensitivity of the detector 20 to the DOI is in addition to the reduction of this sensitivity caused by the better hole cloud collection near the cathode 36 produced by the peak 30 in the intensity of the profile 28 proximate the cathode 36, as explained above.

Accordingly, when both the electrons and the holes are less sensitive to the DOI, the detector 20 of FIG. 2 is less sensitive to DOI and exhibits improved performance. The small-pixel like effect produced by the location of the peak 34 in the electrical field near the anodes 38 further reduces the sensitivity of detector 20 to the DOI.

It may be noted that, for a given HV bias having value V applied between the anodes 38 and the cathode 36, the following is satisfied:

$$V=\int_0^D E(S)ds \qquad \text{Eq (5)}$$

where D is the thickness of the bulk 22 of the detector 20 measured between the surfaces 24 and 26, E(S) is the internal electrical-field in the bulk 22 of the detector 20, and S is the value of the distance coordinate between the cathode 36 and the anodes 38.

From equation (5), it can be seen that the integral over the electrical field along the thickness D of bulk 22 of detector 20 is fixed and is equal to the value V of the HV bias applied between the cathode and the anodes. Accordingly, the enhancement of the electrical field in the regions near the peaks 30 and 34 in regions $R_1$ and $R_3$ corresponds to a diminishment of the electrical field 32 in region $R_2$. Further, the enhancement of the intensities of the electrical field in the regions near the peaks 30 and 34 is shared and split between the regions $R_1$ and $R_3$ of the electrical-field.

Further, after the enhancement of the regions near the peaks 30 and 34 of the electrical field in regions $R_1$ and $R_3$, the detector 20 may be configured such that the electrical-field 32 in region $R_2$ remains strong enough to ensure that, in region $R_2$, the drift time $t_e$ of the electron clouds is much shorter than the lifetime $\tau_e$ of the electrons. Maintenance of a sufficiently strong electrical field in the intermediate region $R_2$ may be taken into account when controlling and adjusting the annealing diffusion process in order to produce an appropriate distribution profile 28 in the bulk 22 of the detector 20.

For purposes of an illustrative analysis, the detector 20 may be divided into three regions $R_1$, $R_2$ and $R_3$ having resistances $r_1$, $r_2$ and $r_3$, respectively. Since regions $R_1$, $R_2$ and $R_3$ are electrically connected in series, the same electrical current flows though these regions. Accordingly, when the HV bias between cathode 36 and anodes 38 across bulk 22 of detector 20 is V, then the voltage drops $V_1$, $V_2$ and $V_3$ on regions $R_1$, $R_2$ and $R_3$, respectively, is given by the voltage-divider formula:

$$V_1 = \frac{V \cdot r_1}{r_1 + r_2 + r_3} \quad \text{Eq (6)}$$

$$V_2 = \frac{V \cdot r_2}{r_1 + r_2 + r_3} \quad \text{Eq (7)}$$

$$V_3 = \frac{V \cdot r_3}{r_1 + r_2 + r_3} \quad \text{Eq (8)}$$

When the lengths of regions $R_1$, $R_2$ and $R_3$ are $L_1$, $L_2$ and $L_3$, respectively, the average internal electrical-fields in these regions are $E_1$, $E_2$ and $E_3$, respectively, and are given by:

$$E_1 = \frac{V \cdot \left(\frac{r_1}{L_1}\right)}{r_1 + r_2 + r_3} = \frac{V}{r_1 + r_2 + r_3}\rho_1 \quad \text{Eq (9)}$$

$$E_2 = \frac{V \cdot \left(\frac{r_2}{L_2}\right)}{r_1 + r_2 + r_3} = \frac{V}{r_1 + r_2 + r_3}\rho_2 \quad \text{Eq (10)}$$

$$E_3 = \frac{V \cdot \left(\frac{r_3}{L_3}\right)}{r_1 + r_2 + r_3} = \frac{V}{r_1 + r_2 + r_3}\rho_3 \quad \text{Eq (11)}$$

where $\rho_1$, $\rho_2$ and $\rho_3$ are the average resistances in regions $R_1$, $R_2$ and $R_3$, respectively. The annealing process via surfaces 24 and 26 in the present example is symmetric, and the high resistance p produced by the annealing goes down rapidly with the distance into bulk 22. Accordingly, the following relationships are satisfied:

$$\rho_1 = \rho_3 >> \rho_2 \quad \text{Eq (12)}$$

Under the conditions of equation (12) and according to equations (9)-(11), the following also applies:

$$E_1 = E_3 >> E_2 \quad \text{Eq (13)}$$

Accordingly, the peaks 30 and 34 in regions $R_1$ and $R_3$, respectively, have equal intensities $E'_1 = E'_3$ of the internal electrical field that are much stronger than the electrical field $E'_2$, which is the electrical field 32 in region $R_2$.

In this example, the strong electrical-field $E'_1$, which is the electrical field including the peak 30 in region $R_1$, improves the collection of hole clouds by the cathode 36. Also, the strong electrical field $E'_3$, which is electrical field including the peak 34 in region $R_3$, improves the small-pixel like effect (even for large anodes). Both strong fields help reduce the sensitivity of detector 20 to the DOI.

Figure 3:
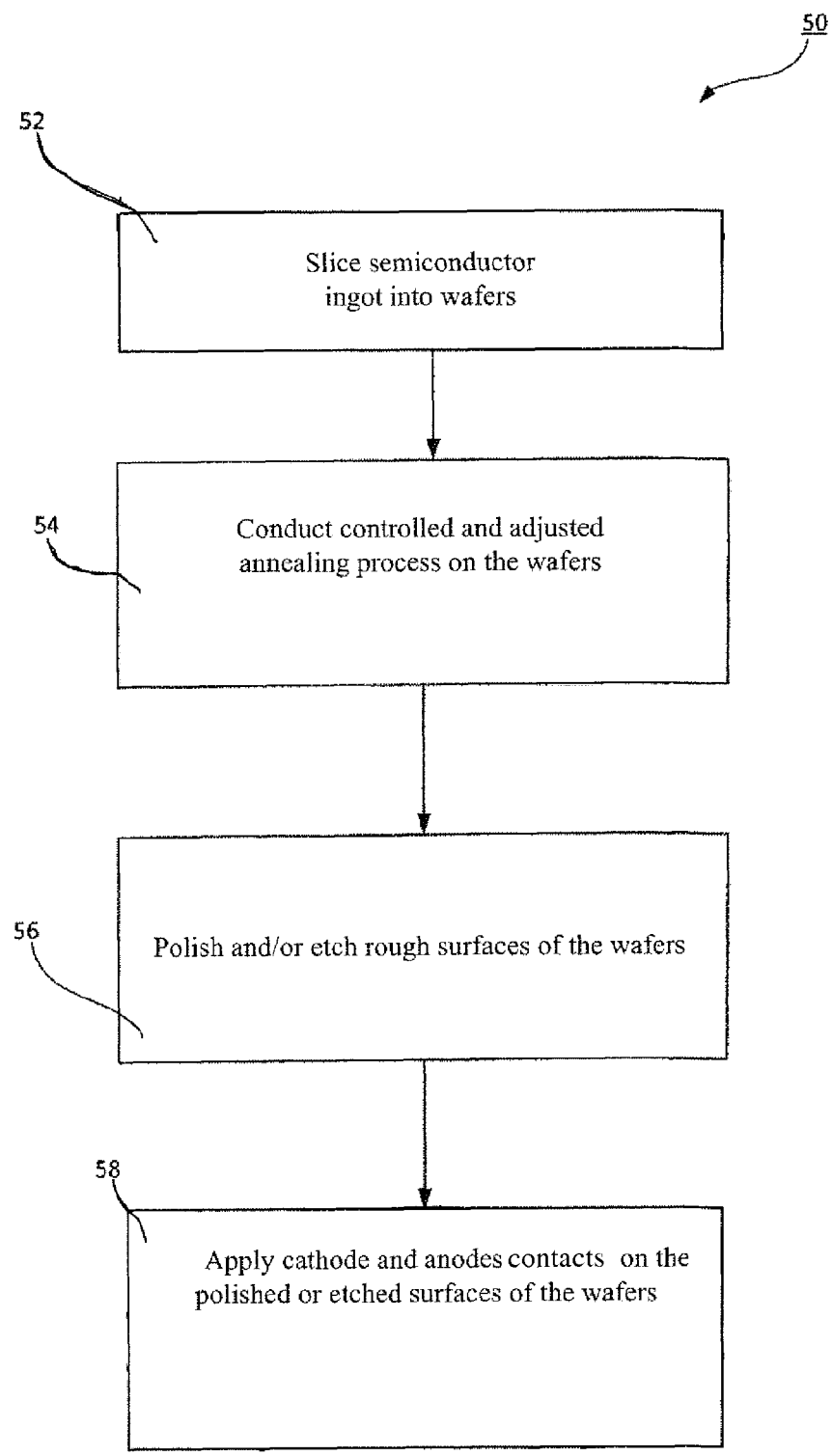
FIG. 3 is a flowchart of a method in accordance with various embodiments.

FIG. 3 is a flowchart of a method 50 that may be used to fabricate a detector such as the detector 20 of FIG. 2 (e.g., a detector having maxima or peak proximate a cathode and anodes). At 52, wafers are sliced from a semiconductor ingot, for example using a disk-saw or a wire-saw. At 54, a controlled and adjusted annealing process is conducted on the wafers. The wafers may have rough surfaces produced during the slicing process of step 52. The controlled and adjusted annealing process may be performed to form wafers having annealing diffusion-profile with high concentration peaks of diffused components in the vicinity of the surfaces of the wafers (such as peaks 30 and 34 of profile 28 of FIG. 2 located proximate surfaces 24 and 26, respectively). At 56, the rough surfaces of the annealed wafers are polished and/or etched to remove or reduce surface and subsurface damage or inconsistencies from these surfaces. At 58, cathode and anodes contacts are applied on the polished or etched surfaces of the wafers. In some embodiments, a single cathode may be provided on a first surface and a plurality of anodes may be provided on an opposite surface. The cathode and/or anodes may be applied by one or more of metal evaporation, metal spattering, electroplating, or electro-less plating to produce radiation detectors.

While the detector 20 of FIG. 2 is much less sensitive to the DOI than conventional detectors, the symmetric peaks 30 and 34 of the internal electrical field in the detector 20 of FIG. 2 may not be strong enough to produce perfect complete charge collection for the hole clouds and/or a perfect small-pixel like effect. It has been found that further enhancement of even only one of the regions of the peaks (e.g., peaks 30 or 34 of FIG. 2) at the expense of the intensity of the electrical field of the region of the other peak may provide either improved charge collection of hole clouds or improved small-pixel like effect (depending on the location of the enhanced region and the location of the diminished region). In such a case, where only the electrical-field in one of the edge regions (e.g., the cathode region or the anode region) is substantially improved to be closer to perfect or ideal, or more efficient, even at the expense of the other edge region (thereby reducing the effect of the other edge region), the detector performances may still be improved relative to the detector 20 of FIG. 2 in various embodiments. For example, enhancing the strength or intensity of the field near the cathode at the expense of the anode may improve hole collection, while enhancing the strength or intensity of the field near the anodes at the expense of the cathode may improve the small-pixel like effect.

Figure 4:
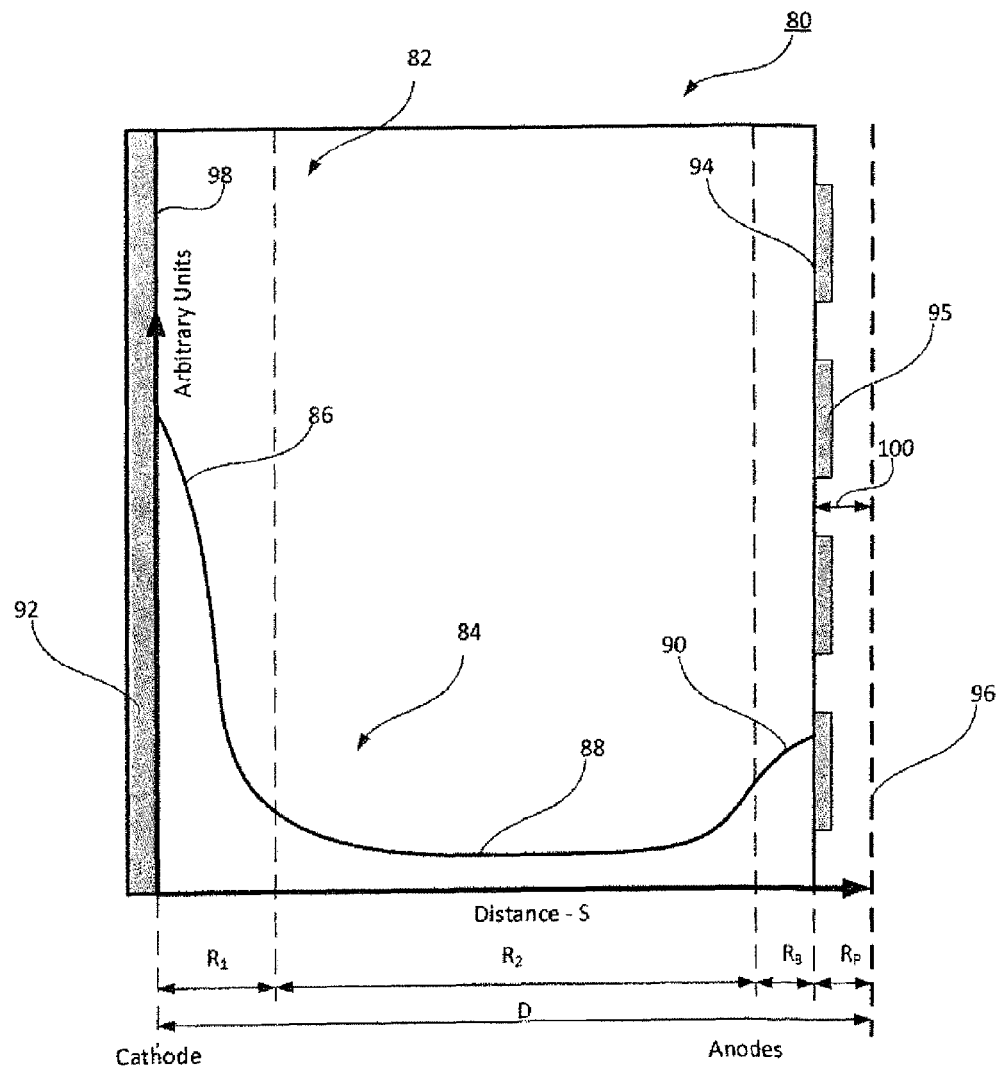
FIG. 4 provides a schematic view of an asymmetric diffusion-distribution or diffusion-profile in accordance with various embodiments.
Figure 5:
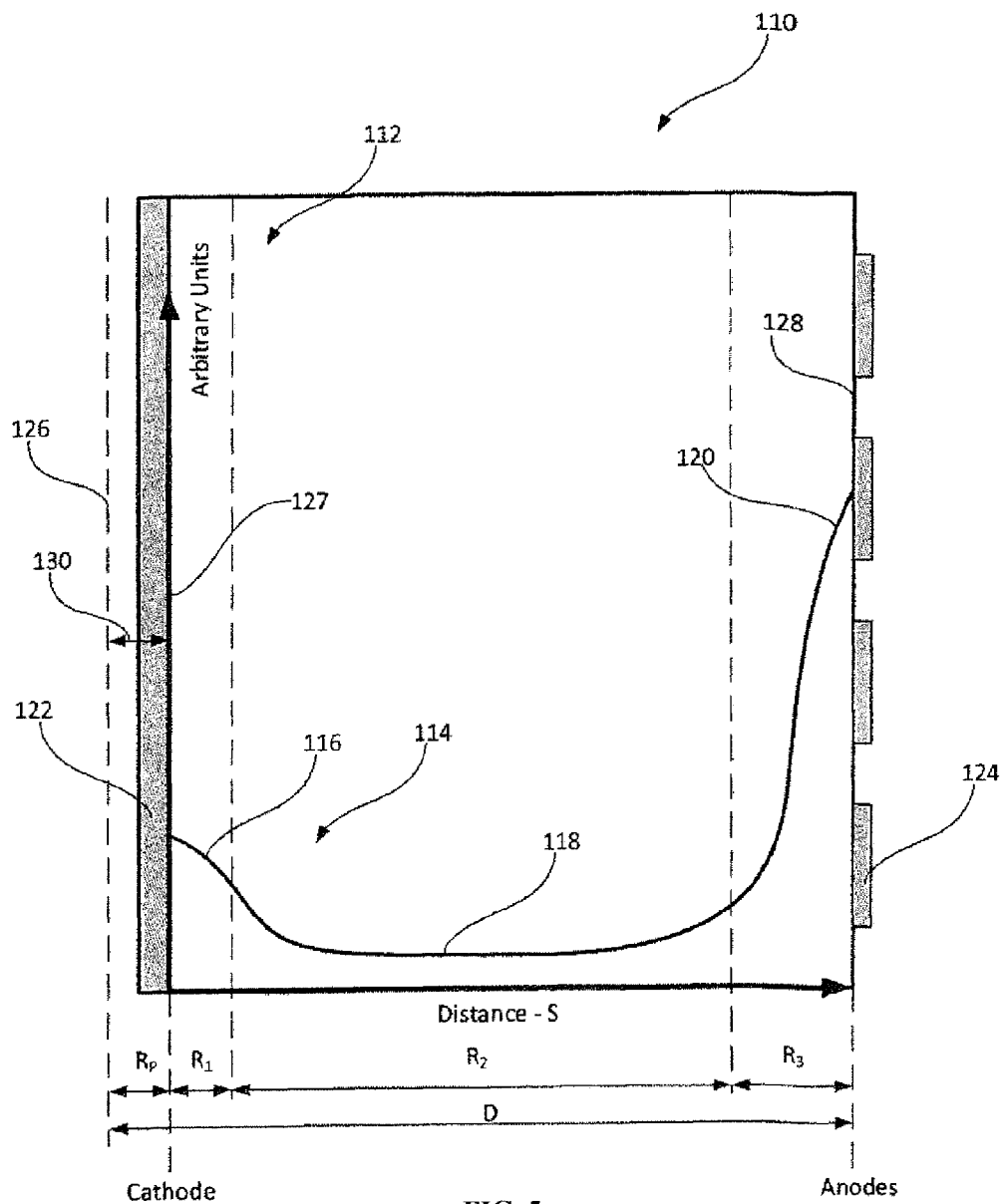
FIG. 5 provides a schematic view of an asymmetric diffusion-distribution or diffusion-profile in accordance with various embodiments.

Accordingly, the internal electrical field of the detector 20 (as depicted by the profile 28) of FIG. 2, which has two symmetric high intensity peaks 30 and 34, may be modified to have an asymmetric profile as shown in FIGS. 4 and 5. According to this modification, when detectors 20, 80 and 110 of FIGS. 2, 4, and 5, respectively, are biased with the same HV, the peak intensities 86 and 120 of the electrical field profiles 84 and 114 in asymmetric detector 80 (see FIG. 4) and asymmetric detector 110 (see FIG. 5), respectively, are each higher than the peak intensities 30 and 34 of the symmetric peaks of the detector 20 of FIG. 2.

On the other hand, when the detectors 20, 80, and 110 of FIGS. 2, 4, and 5, respectively, are biased with the same HV, the peak intensities 90 and 116 of the electrical field profiles 84 and 114 in asymmetric detectors 80 and 110, respectively, are each smaller than the peak intensities 30 and 34 of the symmetric peaks of the electrical field 28 of FIG. 2. The peak intensities 86 (near the cathode 92 of the detector 80 of FIG. 4) and 120 (near the anodes 124 of the detector 110 of FIG. 5) may be understood as being enhanced relative to a symmetric profile, while the peak intensities 90 (near the anodes 95 of the detector 80 of FIG. 4) and 116 (near the cathode 122 of the detector 110 of FIG. 5) may be understood as diminished relative to a symmetric profile.

FIGS. 4 and 5 schematically illustrate profiles or distributions for detectors 80 and 110, respectively, in accordance with various embodiments. In the embodiments of FIGS. 4 and 5, an intensity proximate one of the cathode or anodes has been enhanced at the expense of the intensity at the other of the cathode or the anodes. Namely, the electrical field intensity of one peak of the peaks 86 and 90 of FIG. 4, or of one peak of the peaks 116 and 120 of FIG. 5, is enhanced at the expense of the other peak, in order to modify the performance of the detectors 80 and 110 relative to the detector 20 of FIG. 2. Peaks 86 and 90 of FIG. 4, and peaks 116 and 120 of FIG. 5 are altered from a symmetrical arrangement, with an intensity of one peak increased or enhanced at the expense of the other peak (or, one peak is diminished for the benefit of the other peak). The alteration of the peaks provides an asymmetric shape to distribution profiles 84 and 114 of FIGS. 4 and 5, respectively.

For example, for the detector 80 depicted in FIG. 4, the peak 86 of the profile 84 of the electrical field of the detector 80 (located near the cathode 92) is enhanced by removing part (region $R_P$) from the strong annealed layer of region $R_3$ (located near the anodes 95) to reduce the thickness of region $R_3$, thereby reducing the resistance and the average resistance ρ of the layer or region near the anodes 95. While enhancing the electrical field intensity in region $R_1$ near the cathode 92, the removal of region $R_P$ from region $R_3$ also reduces the electrical field intensity of the peak 90 near the anodes 95 of the detector 80 depicted in FIG. 4.

In various embodiments, the fabrication of the detector 80 of FIG. 4 may begin with a controlled and/or adjusted annealing process similar in certain respects to the process discussed herein in connection the detector 20 of FIG. 2. For example, the annealing process for the detector 80 may be conducted on a wafer having the same initial thickness (e.g., thickness D) used to fabricate the detector 20 of FIG. 2. The thickness D of the detector 80 (or initial thickness) is measured between the surfaces 96 and 98 of the bulk 82 as shown in FIG. 4, which correspond to the surfaces 24 and 26 of bulk 22 of FIG. 2.

For the example detector 80, after the completion of the annealing process, a layer 100 may be removed from the surface 96 of the bulk 82 of the detector 80. As depicted in FIG. 4, the removal amount of the layer 100 is equal to the width of region $R_P$. The removal of region $R_P$ starts at the surface 96 when the bulk 82 has a thickness D, and ends when the bulk 82 is reduced in thickness to surface 94, where the bulk 82 has a thickness D-$R_P$. The removal of region $R_P$ may be achieved, for example, by polishing, grinding, etching, or machining, among others, to remove the semiconductor material without introducing significant or substantial surface and/or sub-surface damage. After the removal of region $R_P$ and surface or sub-surface damage from the surface 94 (e.g., by polishing or etching the surface 94), anodes 95 may be applied on the surface 94.

It may be noted that the widths of regions $R_1$ and $R_2$ of the detector 80 of FIG. 4 are similar to the corresponding widths of regions $R_1$ and $R_2$ of the detector 20 of FIG. 2. However, the width of region $R_3$ of detector 80 is narrower than the width of region $R_3$ of detector 20 by the amount $R_P$ (layer 100) that is removed from the bulk 82 of the detector 80. In region $R_3$ of the detector 80, the region $R_P$ that is removed has the highest resistance, since the region $R_P$ is the region closest to the surface 96 where the annealing diffusion starts and where the resistance of the bulk 82 is the highest. The resistance decreases relatively rapidly with the distance into the bulk 82 according to the diffusion equation erfc. Further, the removal of region $R_P$ also removes the resistance of region $R_P$ from region $R_3$ and thus also contributes to the reduction of resistance $r_3$ and average resistance $ρ_3$ in the thinned region $R_3$ of the detector 80.

In such a case, the thinned region $R_3$ that remains after the removal of the region $R_P$ has a resistance $r_3$ and an average resistance $ρ_3$ that is substantially smaller than the resistance $r_3$ and average resistance $ρ_3$ of the region $R_3$ of detector 20 of FIG. 2, or of the region $R_3$ in the detector 80 of FIG. 4 prior to the removal of the region $R_P$. Prior to the removal of the region $R_P$, the region $R_3$ of the detector 80 was symmetrical to the region $R_1$ of the detector 80 of FIG. 4. For the embodiment depicted in FIG. 4, after the removal of the region $R_P$, the resistances $r_1$ and $r_3$ and the average resistances $ρ_1$ and $ρ_3$ of regions $R_1$ and $R_3$ respectively, satisfy the following relationships:

$$r_1 >> r_3 \text{ and } ρ_1 >> ρ_3 \qquad \text{Eq (14)}$$

If the lowest asymptotic-values of resistance $r_3$ and average resistance $ρ_3$ of region $R_3$ are understood as the values of resistance $r_2$ and average resistance $ρ_2$ of region $R_2$, the following applies:

$$r_3 > r_2 \text{ and } ρ_3 > ρ_2 \qquad \text{Eq (15)}$$

From the relations of equations (14) and (15), the following relationship follows:

$$r_1 >> r_3 > r_2 \text{ and } ρ_1 >> ρ_3 > ρ_2 \qquad \text{Eq (16)}$$

Under the conditions of the relations in equation (16), and in accordance with equations (9)-(11), the relationships between the average electrical fields $E_1$, $E_2$ and $E_3$ in regions $R_1$, $R_2$ and $R_3$ of the detector 80 of FIG. 4, respectively, corresponding to the aspects 86, 88, and 90 in the profile 84 of the internal electrical field in the bulk 82 of the detector 80 may be expressed as:

$$E_1 >> E_3 > E_2 \qquad \text{Eq (17)}$$

Accordingly, when the detectors 80 and 20 of FIGS. 4 and 2, respectively, are biased with the same HV, the intensity of the peak 86 of the profile 84 of the detector 80 is substantially stronger than the intensity of the peak 30 of the profile 28 of the detector 20, resulting in better collection of holes cloud by the detector 80. On the other hand, in this situation, the intensity of the peak 90 of the profile 84 of the detector 80 is substantially weaker than the intensity of the peak 34 of the profile 28 of the detector 20, resulting in a reduced small-pixel like effect for the detector 80 than for the detector 20.

In such a case, the collection of the hole clouds by the cathode 92 of the detector 80 is significantly or substantially more efficient than the collection of the hole clouds by the cathode 36 of the detector 20. However, the small-pixel like effect of the detector 80 is weaker than that of the detector 20. Nevertheless, in various embodiments, the improved or near perfect collection of the hole clouds by the cathode 92 of the detector 80 makes the detector 80 less sensitive to DOI than the detector 20 of FIG. 2.

It may be noted that the enhancement of the intensity of the peak 86 of the profile 84 of the detector 80 relative to the intensity of the peak 30 of the profile 28 in the detector 20 is the result of thinning region $R_3$ by an amount that is equal to the width of $R_P$, and is not due to the reduction of the total thickness of the detector 80 from being equal to D (as for the detector 20). For example, when D is in the range of 3-10 millimeters, and $R_P$ is in the range of 0.1-0.8 millimeters, $$\frac{(D - R_P)}{D} \approx 1.$$

Thus, as discussed herein, a similar pressure, temperature, and time may be used for each surface of a wafer being annealed for both symmetric and asymmetric wafers (e.g., for ease of processing, or processing convenience); however, a layer may be subsequently removed from a surface or a region thinned, after the annealing, to provide an asymmetric distribution or profile. A wafer or bulk may be initially annealed for a similar or symmetric initial distribution or profile and then material removal from one side to produce an asymmetric distribution or profile. In various embodiments, either the cathode side or the anode side may be thinned.

FIG. 5 provides a schematic view of a profile 114 through bulk 112 of a detector 110 that has material removed from a cathode side and an enhanced peak on an anode side. In various embodiments, the fabrication of the detector 110 of FIG. 5 may begin with a controlled and adjusted annealing process similar in certain respects to that used to fabricate the detector 20 of FIG. 2. The annealing process may be conducted on a wafer having the same thickness D used to fabricate the detector 20 of FIG. 2. As seen in FIG. 5, the thickness D is measured between the surfaces 126 and 128 of bulk 112, corresponding to the surfaces 24 and 26 of the bulk 22 of FIG. 2.

After the completion of the annealing process, a layer 130 may be removed from the surface 126 of the bulk 112. As depicted in FIG. 5, the removal amount of the layer 130 is equal to the width of region $R_P$. The removal of region $R_P$ starts at the surface 126 when bulk 112 has a thickness D, and continues to the surface 127, at which point the bulk 112 has a thickness of D-$R_P$. The removal of region $R_P$ may accomplished by one or more of polishing, grinding, etching, or machining, among others. Generally, the removal of material may be performed by one or more processes configured to remove the semiconductor material without substantial or significant surface and sub-surface damage. After the removal of the region $R_p$ and removing the surface and sub-surface damage from the surface 127, the cathode 122 may be applied on the surface 127. The anodes 124 may also be applied to the surface 128, from which no material has been removed. In some embodiments, both surfaces may have at least some material removed to remove surface imperfections, but one surface may have more material removed to provide an asymmetric distribution.

For the case where the bulk 112 has an initial width D that is the same as the width D of the detector 20 of FIG. 2, it may be noted that the widths of the regions R2 (the intermediate region) and R3 (the region proximate the anodes 124) of the detector 110 of FIG. 5 are similar to of the widths of regions R2 and R3, respectively, of the detector 20 of FIG. 2. However the width of the region R1 of the detector 110 is narrower than the width of the region $R_1$ of the detector 20 by the amount $R_P$ (layer 130) that is removed from the bulk 112 of the detector 110. In the region $R_1$ of the detector 110, the region $R_P$ that is removed has the highest resistance (e.g., higher than other portions of the region $R_3$) since it is the portion closest to the surface 126 where the annealing diffusion starts, and where the resistance of the bulk 112 is the highest. The resistance of the bulk 112 decreases rapidly with increasing distance into the bulk 112 as shown in FIG. 5, according to the diffusion equation erfc. Further, the removal of region $R_P$ also removes the resistance of region $R_P$ from region $R_1$ and thus also contributes to the reduction of resistance $r_1$ and average resistance $\rho_1$ in the thinned region $R_1$ of detector 110.

In this case, the thinned region $R_1$ that remains after the removal of region $R_P$ has a resistance $r_1$ and an average resistance $\rho_1$ that are significantly or substantially smaller than the resistance $r_1$ and average resistance $\rho_1$ of region $R_1$ of the detector 20 of FIG. 2, or of the region $R_1$ of the detector 110 of FIG. 5 prior to the removal of the region $R_P$. Prior to the removal of the region $R_P$, the region $R_1$ of the detector 110 was symmetrical to the region $R_3$ of the detector 110. Accordingly the resistances $r_1$ and $r_3$ and the average resistances $\rho_1$ and $\rho_3$ of regions $R_1$ and $R_3$ respectively, satisfy the following relationships:

$$r_3 >> r_1 \text{ and } \rho_3 >> \rho_1 \qquad \text{Eq (18)}$$

When the lowest asymptotic values of resistance $r_1$ and average resistance $\rho_1$ of region $R_1$ are the values of resistance $r_2$ and average resistance $\rho_2$ of the region $R_2$, the following applies:

$$r_1 > r_2 \text{ and } \rho_1 > \rho_2 \qquad \text{Eq (19)}$$

The following relationships follow from the relations of equations (18) and (19):

$$r_3 >> r_1 > r_2 \text{ and } \rho_3 >> \rho_1 > \rho_2 \qquad \text{Eq (20)}$$

Under the conditions of the relations in equation (20) and in accordance with equations (9)-(11) the relationships between the average electrical fields $E_1$, $E_2$ and $E_3$ in regions $R_1$, $R_2$ and $R_3$ of detector 110 of FIG. 5, respectively, corresponding to the portions 116, 118, and 120 of the profile 114 of the internal electrical field in the bulk 112 may be expressed as follows:

$$E_3 >> E_1 > E_2 \qquad \text{Eq (21)}$$

Under these conditions, when the detectors 110 and 20 of FIGS. 2 and 5, respectively, are biased with the same HV, the intensity of the peak 120 of the profile 114 of the detector 110 is substantially or significantly stronger than the intensity of the peak 34 of the profile 28 of the detector 20, resulting in a stronger small-pixel like effect for the detector 110 than for the detector 20. On the other hand, under the same conditions, the intensity of the peak 116 of the profile 114 of the detector 110 is substantially or significantly weaker than the intensity of the peak 30 of the profile 28 of the detector 20, resulting in less effective collection of hole clouds by the cathode 122 of the detector 110 in comparison to the cathode 24 of the detector 20.

In such a case, the small-pixel like effect in the detector 110 is much stronger than the small-pixel like effect in the detector 20, but the collection efficiency of hole clouds by the detector 110 is less efficient than for the detector 20. In various embodiments, the near perfect or substantially improved small-pixel like effect of the 110 makes the detector 110 less sensitive to DOI than the detector 20 of FIG. 2.

It may be noted that the enhancement of the intensity of the peak 120 of the profile 114 of the detector 110 relative to the intensity of the peak 34 of the profile 28 of the detector 20 results from the thinning of region $R_1$ by an amount equal to the width of $R_P$. The enhancement of the peak 120 is not due to the reduction of the total thickness of detector 110 from D to D-$R_P$. For example, with D in the range of 3-10 millimeters and $R_P$ in the range of 0.1-0.8 millimeters, $$\frac{(D - R_P)}{D} \approx 1.$$

It may further be noted that the small-pixel like effect of the detector 110 provides the advantages of near perfect or near ideal small-pixel effect, but without drawbacks of small pixels (e.g., drawbacks related to the larger number of channels required for small pixels or drawbacks related to voltage required for steering grids).

Figure 6:
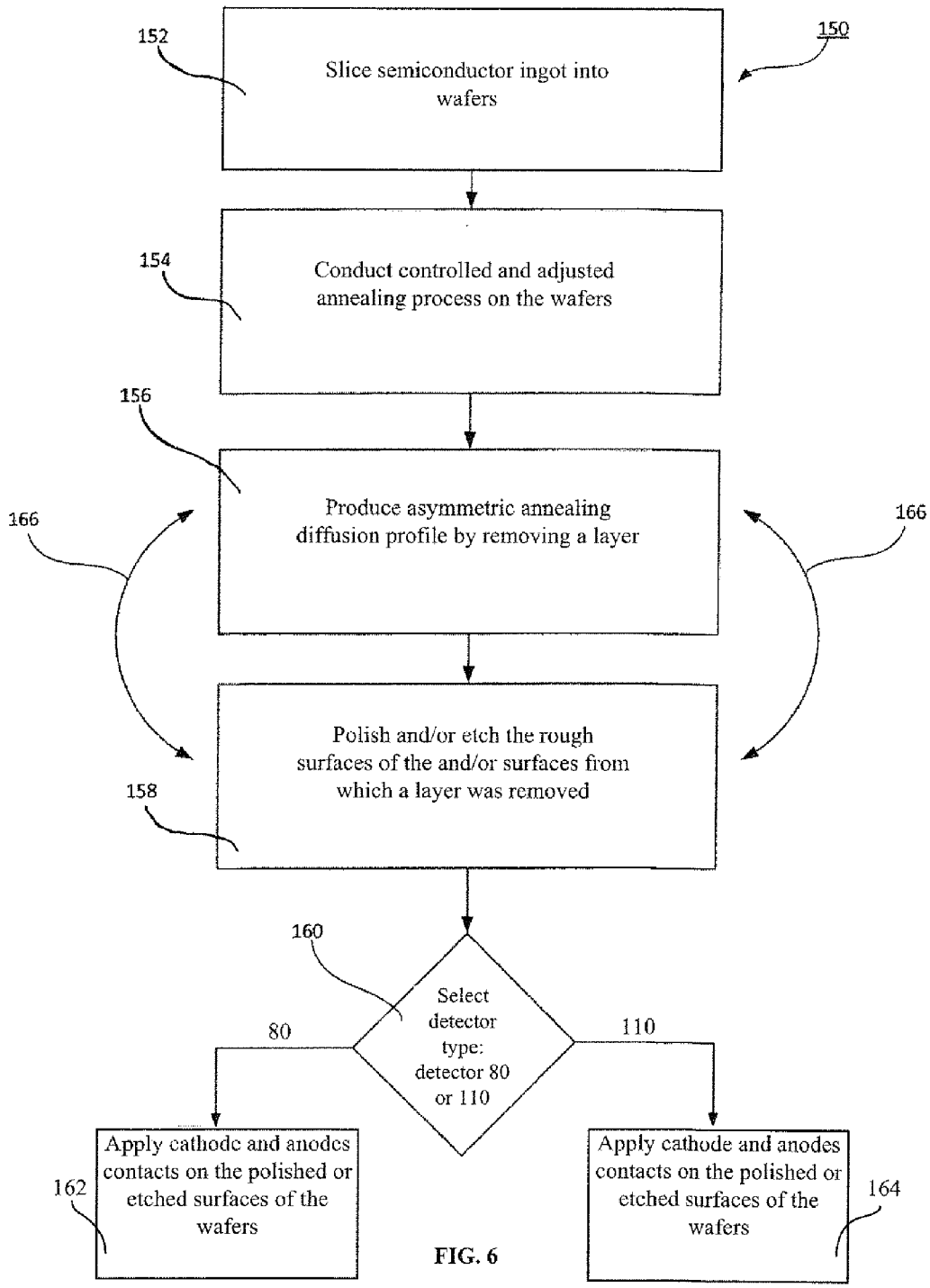
FIG. 6 is a flowchart of a method in accordance with various embodiments.

FIG. 6 provides a flowchart of a method 150 that may be used to fabricate detectors (e.g., detectors 80 and 110 of FIGS. 4 and 5) in accordance with various embodiments. At 152, wafers (e.g., semiconductor wafers such as CZT wafers) are sliced from a semiconductor ingot, for example with a disk saw or wire saw. At 154, a controlled and adjusted annealing process is conducted on the wafers produced by the slicing at 152, to provide an annealing diffusion profile within the bulk of each wafer having high concentration peaks of diffused components in the vicinity of opposed external surfaces of the wafers, for example corresponding to the peaks 30 and 34 of the profile 28 of FIG. 2. The annealing, for example, may be controlled by adjusting diffusion parameters T (temperature), P (gas pressure), and t (annealing time) as discussed herein.

At 156, an asymmetric annealing diffusion profile of the diffused components and the concentration thereof (as well as corresponding properties such as an electrical field profile) is produced by removing a layer from one surface of the wafers. For example, in some embodiments, a layer having a thickness in the range of about 100-1000 µm (or about 0.1-1.0 millimeters) may be removed from one surface of the annealed wafers using one or more of polishing, grinding, etching, or machining, among others. In some embodiments, the width of edge regions of the wafer (e.g., regions R1 and R3 of the detectors 20, 80, and 110 of FIGS. 2, 4 and 5) may be in the range of 800-1000 µm (or about 0.8-1.0 millimeters). Accordingly, to create an asymmetric annealing diffusion profile (e.g., profiles 84 and 114 discussed herein), the layer thickness that is removed from the detector thickness may be configured or selected to be thick enough to create the asymmetric effect. The thicker the removed layer, the stronger is the asymmetric effect produced. However, when the thickness of this layer reaches the width of regions R1 or R3, further removal of the thickness of the removed layer will not substantially contribute to the asymmetric effect, since beyond regions R1 and R3, the distribution curve is in region R2 in which the distribution curve is generally flat. Thus, in various embodiments the typical thickness of the removed layer at 156 may be in the range of 100-1000 µm for wafers having initial edge regions in the range of 800-1000 µm. It may be noted that the particular ranges discussed herein are meant by way of example for illustrative purposes, and that other values of ranges may be employed in various embodiments.

In the illustrated embodiment, at 158, the rough surfaces of the wafers resulting from the slicing at 152 and/or the surfaces from which a layer was removed at 156 may be processed to remove surface and subsurface damage or imperfections from these surfaces. For example, the surfaces may be one or more of polished or etched. It may be noted, for example as depicted by arrows 166 of FIG. 6, that even though step 156 appears in FIG. 6 prior to step 158, the steps may be performed in a different order (e.g., all or a portion of step 158 may be conducted prior to all or a portion of step 156).

At 160, the type or configuration of the fabricated detector is selected. For example, if a detector similar to the detector 80 (e.g., having a profile having a larger peak proximate to the cathode instead of the anodes) is selected, the method 150 proceeds to 162. However, if a detector similar to the detector 110 (e.g., having a profile having a larger peak proximate to the anode instead of the cathodes) is selected, the method 150 proceeds to 162.

If the detector type selected at 160 is of the type of the detector 80, at 162 anodes are applied on to the surfaces of the wafers from which a layer was removed at 156, and cathodes are applied to the opposing surfaces. The surfaces to which the cathodes and anodes are applied may be polished and etched (e.g., at 158).

If the detector type selected at 160 is of the type of the detector 110, at 164 cathodes are applied on to the surfaces of the wafers from which a layer was removed at 156, and anodes are applied to the opposing surfaces. The surfaces to which the cathodes and anodes are applied may be polished and etched (e.g., at 158).

It may be noted that the application of anodes and cathode on the polished or etched surfaces of the wafers done at step 162 and/or 164 may be performed with one or more of metal evaporation, metal spattering, electro-plating or electro-less plating.

It may further be noted that other techniques may be employed additionally or alternatively to produce wafers having asymmetric profiles as discussed herein. For example, the fabrication method discussed in connection with FIG. 6 results in the removal of a relatively thick layer (for example, up to 1000 µm (or about 1.0 mm) in some embodiments) from the bulk of the processed wafers. The removal of such a layer may be more costly than desired due, for example, to the loss of a relatively large amount of relatively expensive semiconductor material from which the wafers are produced, or, as another example, due to the amount of equipment-time and labor-time associated with the removal of such relatively thick layers.

An alternative technique to produce asymmetric diffusion profiles corresponding to asymmetric electrical-field profile will now be discussed in connection with the embodiments depicted schematically by FIGS. 7 and 8, and the flow chart of a method 240 of FIG. 9. In the fabrication processes described above in connection with FIG. 6, for example, the annealing process was performed on the wafers after the wafers were sliced. It may be noted that, following the slicing process, the wafers may have rough surfaces through which the diffusion of the annealing process is performed into and out of the bulk of the wafers. The roughness of the surfaces through which the diffusion of the annealing process is conducted enhances the diffusion of the annealing process. For example, rough surfaces may have a relatively large surface area (e.g., relative to a smooth surface), that enhances diffusion during annealing. As another example, rough surfaces may include damage or imperfections (or a relatively larger amount thereof), such as one or more of surface damage, subsurface damage, micro-cracks, lattice vacancies, or lattice disorder, which also enhance diffusion.

Accordingly, in various embodiments, the efficiency of the annealing diffusion process may be controlled by controlling the roughness of the surface through which the annealing diffusion is performed. For example, smoothing the roughness of one surface of the wafer, by a polishing process, for example, reduces the annealing diffusion efficiency through the smoothed surface relative to a non-smoothed surface (e.g., an opposing surface that is not smoothed or is smoothed to a lesser extent than the smoothed surface). If one surface of the wafer is smoothed after the slicing, and the opposing surface of the wafer is left as rough as it is after the slicing (or smoothed to a substantially or significantly lower degree), the annealing diffusion process that follows may be substantially or significantly more efficient through the rough surface than through the smoothed surface. The difference in annealing efficiency depends on the degree of difference in roughness or smoothness between the opposed surfaces.

Figure 7:
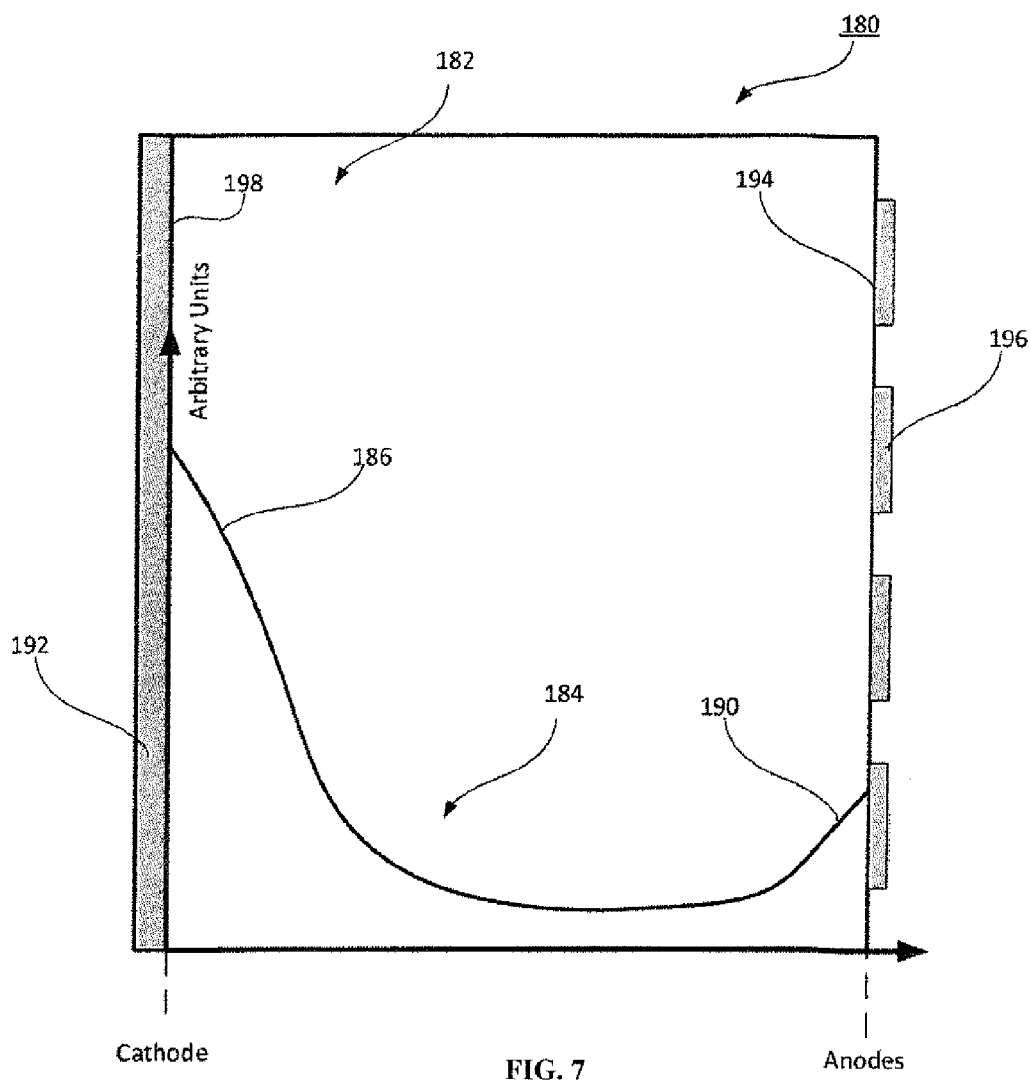
FIG. 7 provides a schematic view of an asymmetric diffusion-distribution or diffusion-profile in accordance with various embodiments.

FIG. 7 schematically depicts a detector 180 having an asymmetric annealing diffusion-profile 184, and also schematically depicts the corresponding electrical field profile (also 184) produced in the detector 180 when the detector 180 is biased by HV. The high intensity peak 186 of the electrical field in the profile 184 is produced by the highly efficient annealing diffusion process through the rough surface of the bulk 182 during the annealing process, which for the embodiment depicted in FIG. 7, is surface 198 of the bulk 182 in the detector 180 was the rough surface of bulk 182 during the annealing process. The surface 198 of detector 180, for example after annealing, may be polished and/or etched to remove surface and/or sub-surface damage to prepare the surface 198 for the application of cathode 192 to the surface 198.

The low intensity peak 190 of the electrical field in the profile 184 is produced by the relatively inefficient annealing diffusion process through the smooth surface of bulk 182, which is surface 194 in the illustrated embodiment. The surface 194 of detector 180 may be further polished and/or etched, after annealing, to remove surface and/or sub-surface damage in preparation for the application of the anodes 196 to the surface 194.

Similar to the detector 80 of FIG. 4, the detector 180 of FIG. 7 has increased efficiency in collecting hole clouds by the cathode 192 due to the profile 184 having the high intensity peak 186 near the cathode 192 of the detector 180. The detector 180 is similar in certain respects to the detector 80 of FIG. 4; however, the detector 180, unlike the detector 80, is fabricated without the removal of a relatively thick layer from the wafer bulk 182. Accordingly, the detector 180, which has similar performance or efficiency in comparison to the detector 80, may be fabricated without the expenses associated with the removal of relatively thick layer from bulk 182, thereby reducing one or more of material loss, equipment-time, or labor-time.

Figure 8:
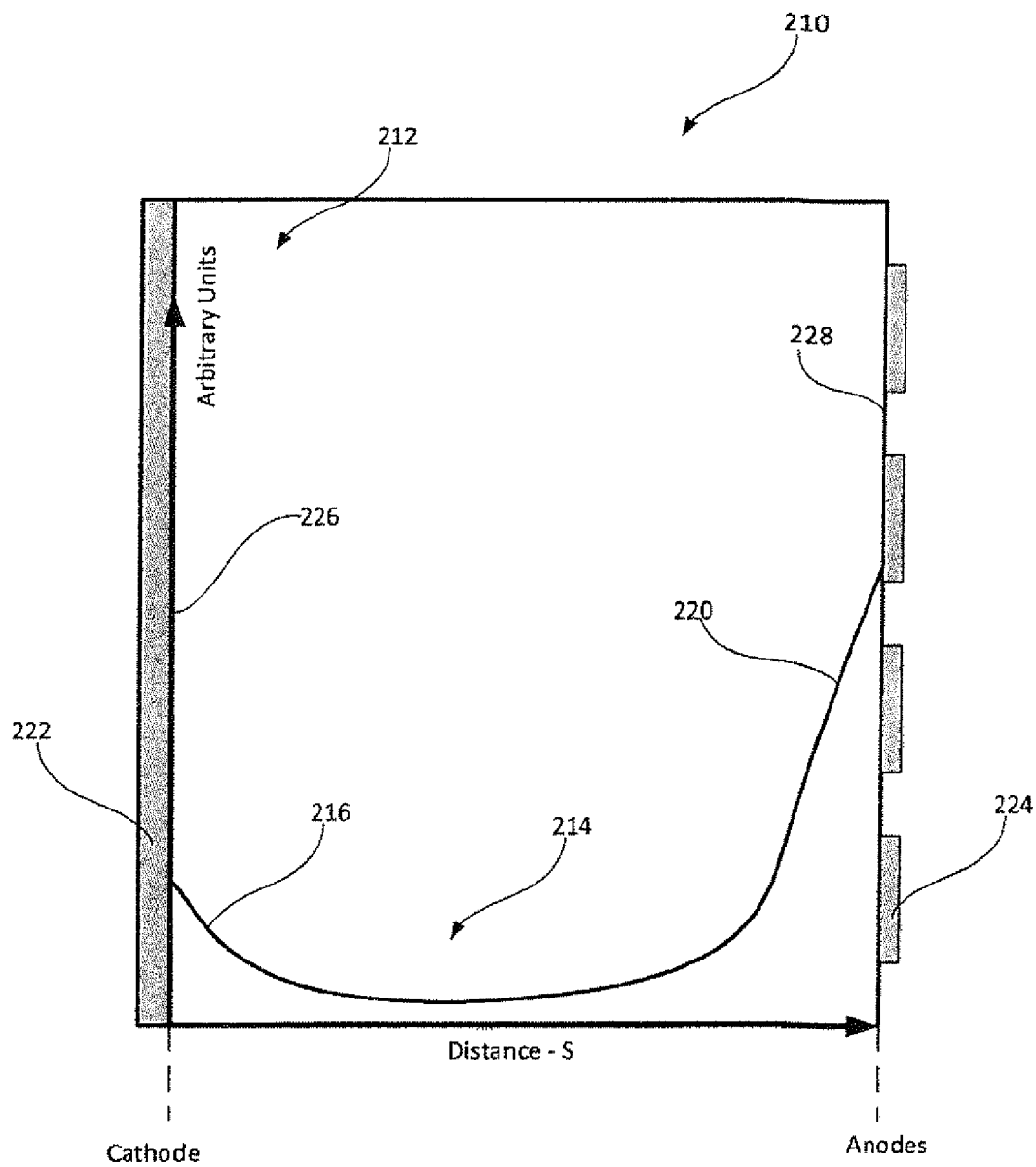
FIG. 8 provides a schematic view of an asymmetric diffusion-distribution or diffusion-profile in accordance with various embodiments.

FIG. 8 schematically depicts a detector 210 having an asymmetric annealing diffusion profile 214, and also schematically represent the electrical field profile (also 214) produced in detector 210 when the detector 210 is biased by HV. The high intensity peak 220 of the electrical field in profile 214 is produced by the highly efficient annealing diffusion process through the rough surface of the bulk 212. For the embodiment depicted in FIG. 8, surface 228 of the bulk 212 of the detector 210 was the rough surface during the annealing process (with opposing surface 226 the smooth surface during annealing). After annealing, for example, the surface 228 of the detector 210 may be polished and/or etched to remove surface and/or sub-surface damage in preparation for the application of the anodes 224 to the surface 228.

The low intensity peak 216 of the electrical field of the profile 214 is produced by the relatively inefficient annealing diffusion process through the smooth surface of bulk 212. For the embodiment depicted in FIG. 8, the surface 226 (to which a cathode 222 will subsequently be applied) of the detector 210 is the smooth surface of the bulk 212 during the annealing process. The surface 226 of the detector 210 may be polished and/or etched to remove surface and/or sub-surface damage to prepare the surface 226 for the application of the cathode 222 thereto.

The detector 210 of FIG. 8, similar to the detector 110 of FIG. 5, exhibits a relatively strong small-pixel like effect due to the high intensity peak 220 of the electrical field profile 214 being located near the anodes 224 of the detector 210. However, the detector 210, unlike the detector 110, may be fabricated without removal of a relatively thick layer from the wafer bulk 212. Accordingly, the detector 210, which exhibits similar performance or efficiency to the detector 110, may be fabricated without the expenses associated with the removal of a relatively thick layer from the bulk, including, for example, material loss, equipment-time, and/or labor-time.

Figure 9:
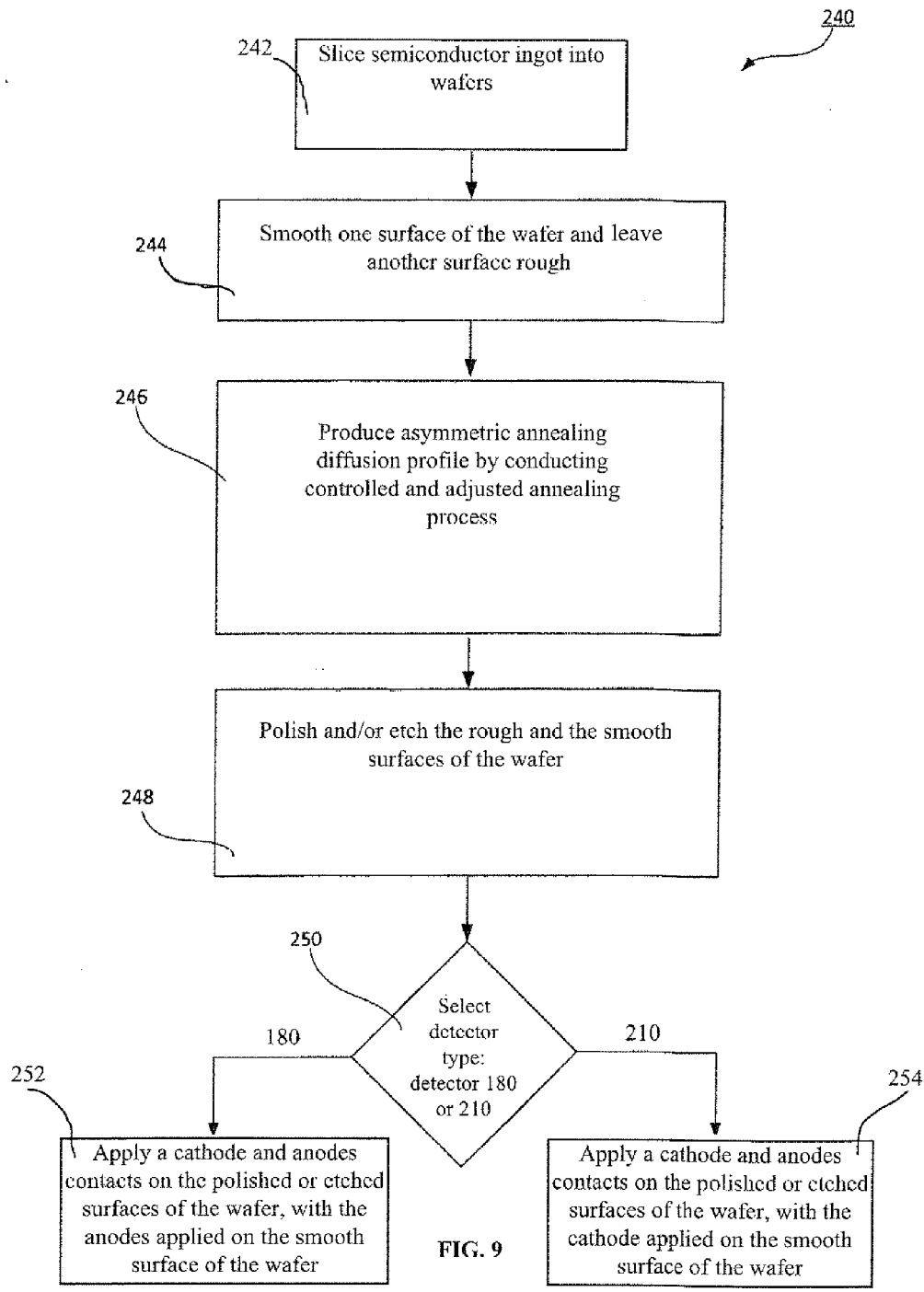
FIG. 9 is a flowchart of a method in accordance with various embodiments.

FIG. 9 provides a flowchart of a method 240 that may be used to fabricate detectors such as the detector 180 or the detector 210 discussed herein. At 242, wafers are sliced from a semiconductor ingot. The wafers may be sliced from the ingot, for example, using a disk saw or a wire saw. The slicing may result in rough surfaces on opposing sides of the wafers. At 244, in the illustrated embodiment, one surface of the rough surfaces of each of the wafers is smoothed, while a surface opposing the smoothed surface for each of the wafers is left as a rough surface as received from the slicing of 242 (or, alternatively, the surface opposing the smooth surface may be smoothed to a lesser extent than the smooth surface).

At 246, an asymmetric annealing diffusion profile of the diffused components and the concentration of the components is provided via a controlled and adjusted annealing process on the wafers, via the rough surfaces on one side and via the smoothed surfaces on the other side, to provide the wafers with an asymmetric annealing diffusion profile having high and low concentration peaks of diffused components, such as depicted in FIGS. 7 and 8. The higher peak in the depicted examples is proximate the rough surfaces, and the lower peak in the depicted examples is proximate the smooth surfaces.

At 248 of the depicted embodiment, the rough surfaces and the smoothed surfaces of the wafers that were annealed at 246 are processed to remove surface and/or sub-surface damage from the surfaces. The surfaces, for example, may be polished and/or etched in preparation for application of cathodes or anodes thereto.

At 250, the type of detector (e.g., as defined by the distribution profile and location/relative size of peaks) is selected to be either of the type of the detector 180 (e.g., highest peak of profile proximate the cathode) or of the type of the detector 210 (e.g., highest peak of profile proximate the anodes). If the detector type selected at 250 is of the type of the detector 180, the method 240 proceeds to 252. At 252, a cathode contact is applied to the rough surface (e.g., the rough surface during annealing that has been subsequently polished and/or etched) of each wafer, and anode contacts are applied to the smooth surface (e.g., the smooth surface during annealing). If the detector type selected at 250 is of the type of the detector 210, the method 240 proceeds to 254. At 254, anode contacts are applied to the rough surface (e.g., the rough surface during annealing that has been subsequently polished and/or etched) of each wafer, and a cathode contact is applied to the smooth surface (e.g., the smooth surface during annealing). Again, it may be noted that the application of anodes and cathodes on the surfaces of the wafer at 252 or 254 may be achieved via one or more of metal evaporation, metal spattering, electro-plating, or electro-less plating.

Another example of an alternative technique to produce asymmetric annealing diffusion-profile corresponding to an asymmetric electrical field profile will now be discussed in connection with the schematic illustrations of FIGS. 10 and 11, and the flow chart of FIG. 12.

From above, for the fabrication processes described herein in connection with FIGS. 4-6, the asymmetric annealing diffusion profile is produced by removing a relatively thick annealed layer. For the fabrication processes described herein in connection with FIGS. 7-9, one surface is smoothed (or smoothed to a greater extent) than an opposing surface prior to the annealing process. Thus, it may be noted that the processes for creating an asymmetric annealing diffusion profile for the examples of FIGS. 4-9 involve at least one processing step in which one surface of each wafer is processed (e.g., processed additionally to other steps performed on both sides of the wafer) in order to create the asymmetry of the annealing diffusion profile. For the example discussed in connection with FIGS. 10-12, the additional step of additionally processing one surface is removed.

Figure 10:
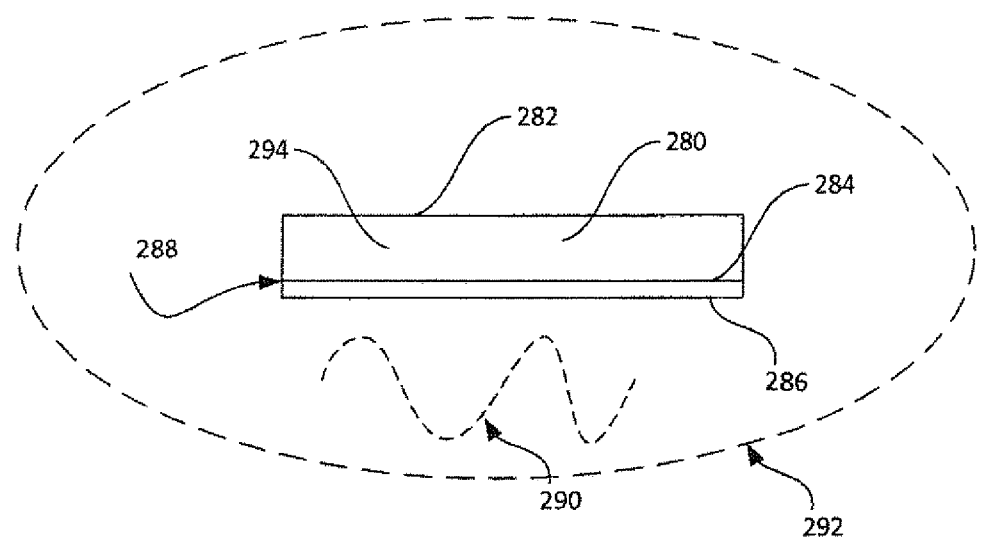
FIG. 10 is a schematic illustration of a configuration providing an asymmetric diffusion-distribution or diffusion-profile in accordance with various embodiments.

FIG. 10 schematically depicts a semiconductor wafer 280, from which a radiation detector may subsequently be made. During at least a portion of the annealing of the wafer 280, one of the surfaces 282 and 284 is in contact with a plate 286, such as a quartz plate or other pure material suitable for use at high temperature. In the illustrated embodiment, the surface 284 is in contact with the plate. Alternatively, the surface 284 may be near contact with the plate 286 but spaced a relatively very small distance apart during part or all of the annealing process. During the annealing process, the wafer 280 is surrounded by an atmosphere of a gas 290, such as Te or Cd vapors that surround a CdTe or CZT wafer. In various embodiments, the gas 290 may be confined in a heated chamber schematically illustrated by volume 292 in FIG. 10. The plate 286 may be attached or joined to, or positioned near to, the surface 284 of wafer 280 via an interface 288 between the plate 286 and the wafer 280. The plate 286 in the illustrated embodiment, when secured in or near contact to the surface 284, acts to prevent or partially prevent diffusion of the gas 290, which surrounds the wafer 280, via the surface 284 of the wafer 280.

The gas 290 that surrounds the wafer 280 is utilized in the annealing diffusion process and in the control of the annealing diffusion process. In the case that the diffusion is into the wafer 280, the gas 290 is a source of the diffusion. In the case that the diffusion is from the interior of the bulk 294 of the wafer 280 to the outer region or regions of the wafer 280, the surrounding gas 290 creates and/or influences a concentration gradient that maintains the diffusion. The surrounding gas 290 interacts with the diffused components that exist on the surfaces of the wafer 280 and accordingly may create new compounds. The creation of new compounds on the surface of wafer 280 reduces the concentration of the original components that previously existed on the surfaces of wafer 280 prior to the interaction with the gas 290. This concentration reduction creates a concentration gradient that causes more components to diffuse to the surface of the wafer 280 where they interact with the gas 290. The concentration of the components arriving to the surface, by diffusion, is reduced by the interaction with gas 290, and thus additional diffusion of such components into the bulk 294 is enhanced. This process may be maintained by the interaction between the diffused components and the gas 290, and may repeat itself again and again according to the diffusion law during the annealing process.

Accordingly, the presence of the gas 290 around the surfaces of wafer 280 plays a role in the annealing diffusion process, and controlling the amount of gas around the surfaces of wafer 280 (e.g., via placement of the plate 286 at or near one of the surfaces) controls the efficiency of the annealing diffusion process. For example, whether or not the plate 286 is in contact with the surface, the distance between the plate 286 and the surface, and/or the amount or proportion of time the plate 286 is at or near the surface may be controlled to control the efficiency of the diffusion process with respect to the surface.

In FIG. 10, the wafer 280 is placed on or near the plate 286 such that the arrival of the gas 290 into the interface 288 between the wafer 280 and the plate 286 is limited and controlled by the size of the gap between wafer 280 and plate 286. Accordingly, the annealing diffusion process performed via the surface 284 of the wafer 280, to which the arrival of gas 290 is reduced by the presence of the plate 286, is less efficient than the annealing diffusion process done via the opposing surface 282 of the wafer 280 to which the gas 290 arrives freely (e.g., unimpeded by the plate 286). The different efficiencies of the annealing diffusion process via the surfaces 282 and 284 create an asymmetric annealing diffusion profile in the bulk 294, with the concentration of the diffused components in the bulk 294 having two peaks, namely a high concentration peak under or near the surface 282 (the surface to which the gas 290 flows freely), and a lower peak concentration peak under the surface 284 (the surface to which the plate 286 impedes the flow or availability of the gas 290). The asymmetric annealing diffusion profile produced in the bulk 294 may be generally similar to the asymmetric annealing diffusion profiles 84, 114, 184 and 214 discussed herein.

Figure 11:
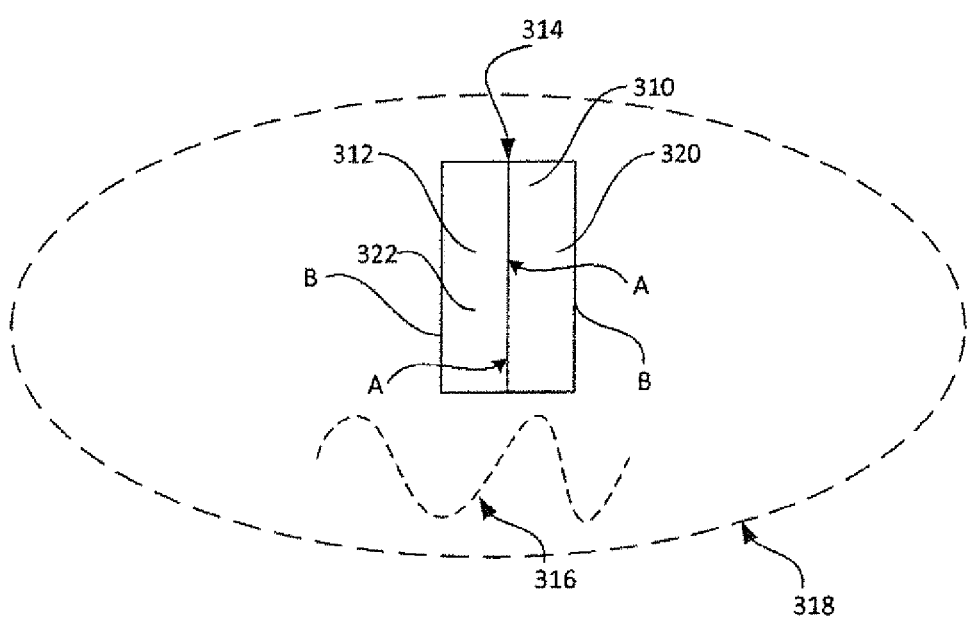
FIG. 11 is a schematic illustration of a configuration providing an asymmetric diffusion-distribution or diffusion-profile in accordance with various embodiments.

FIG. 11 schematically illustrates an additional example of a method for producing an asymmetric annealing diffusion profile. Similar to the example embodiment discussed in connection with FIG. 10, the example embodiment of FIG. 11 controls the flow or availability of a gas to a surface; however, instead of employing the plate 286, in FIG. 11 another wafer plays a role similar to the role of the plate 286 (e.g., limiting the arrival of a gas 316 to surface A of a wafer 310). While the wafer 310 limits the arrival of the gas 316 to the surface A of the wafer 312, the gas 316 may be confined in a heated chamber schematically illustrated by volume 318 in FIG. 11.

Accordingly, the wafer 312 serves as a blocking plate (e.g., impeding the flow or availability of the gas 316) for the wafer 310 and, at the same time, the wafer 310 serves as a blocking plate for the wafer 312. Accordingly, for the embodiment depicted in FIG. 11, the use of an additional plate (e.g., plate 286 of FIG. 10) may be eliminated. The asymmetric annealing diffusion profile is produced in FIG. 11 by attaching pairs of wafers 310 and 312 having corresponding sides A that are attached or joined to each other (or positioned near enough each other to impede the availability of the gas 316) for at least a portion of an annealing process. Accordingly, the arrival of the gas 316, via an interface 314 between the surfaces A of the wafers 310 and 312 is limited and the efficiency of the annealing diffusion process via the surfaces A is reduced. The efficiency of the annealing diffusion process via the surfaces A can be controlled, for example, by adjusting the gap size of interface 314 between surfaces A and/or the amount of time the surfaces A are in contact or near contact with each other to impede the availability of the gas 316. The gas 316 has free access to sides B (which are opposed to the sides A) of wafers 310 and 312. Accordingly, the annealing diffusion process via sides B is more efficient than the annealing diffusion process via sides A. In this case, each pair of wafers 310 and 312 has less efficient annealing vie their sides A and more efficient annealing in their sides B.

The different efficiencies of the annealing diffusion process via surfaces A and B of the wafers 310 and 312 create asymmetric annealing diffusion profiles in the bulks 320 and 322 of the wafers 310 and 312. The concentration of the diffused components in the bulks 320 and 322 has two peaks. A first, higher peak is located under or near the surfaces B, and a second, lower peak is located under or near the surfaces A. The asymmetric annealing diffusion profiles produced in the bulks 320 and 322 of the wafers 310 and 312 may be generally similar to the asymmetric annealing diffusion profiles 84, 114, 184 and 214 discussed herein.

Figure 12:
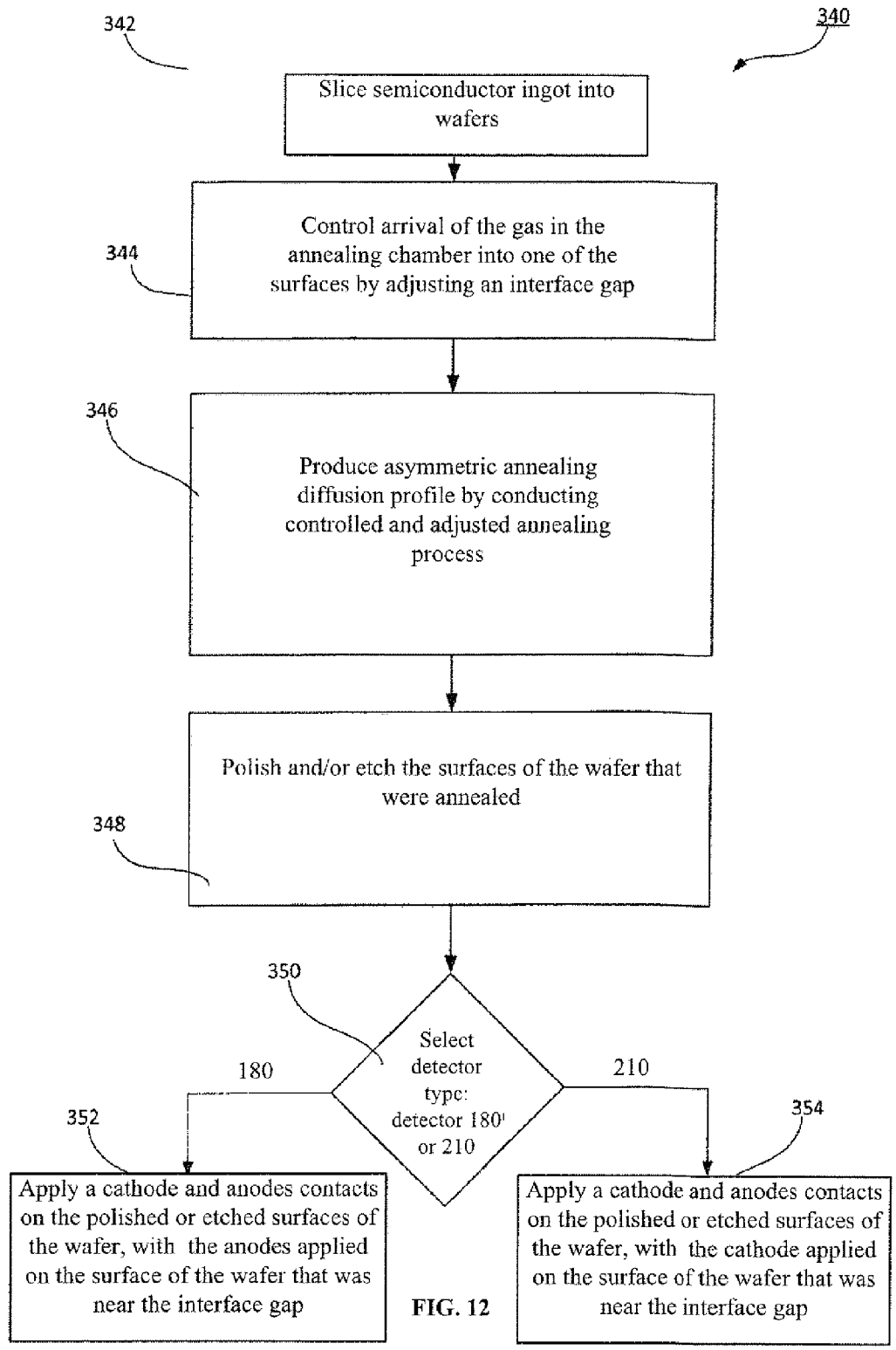
FIG. 12 is a flowchart of a method in accordance with various embodiments.

FIG. 12 is a flowchart of a method 340 that may be used to fabricate detectors, such as the detectors 180 and 210. At 342, wafers are sliced from a semiconductor ingot, for example using a disk saw or a wire saw. Next, at 344, the arrival of a gas in an annealing chamber is controlled into one of the surfaces of the annealed wafer by adjusting an interface gap between the surface and a blocking surface (in some embodiments the gap may be adjusted to a zero value, at which point the gap does not exist and the surface and blocking surface are in contact with each other). The blocking surface, for example, may be a surface of a plate or, as another example, may be the surface of another wafer. In the depicted embodiment, free access of the gas to another surface (e.g., a surface opposed to the surface for which access of the gas is impeded by the blocking surface) of the wafer is permitted.

At 346, an asymmetric annealing diffusion profile of the diffused components and their concentration is produced. For example, at 346, a controlled and adjusted annealing process may be performed. On one side of the wafer, the annealing is performed via the interface gap adjusted in processing step 344 to form an asymmetric annealing diffusion-profile having high and low concentration peaks of diffused components. The high concentration peak is provided proximate the surface to which the flow or availability of gas is not impeded, while the low concentration peak is located near the adjustable interface gap used to impede the flow or availability of gas to the corresponding surface of the wafer.

At 348, the surface with the high efficiency annealing process and the surface with the less efficient annealing process may both be polished and/or etched. The processing at 348, for example, may be performed to remove or reduce surface and/or sub-surface damage to prepare the surfaces for application of cathodes and anodes.

At 350, the type of the fabricated detector is selected to be either of the type of detector 180 (e.g., having a profile having a higher peak proximate a cathode side) or of the type of detector 210 (e.g., having a profile having a higher peak proximate an anode side). If the type of detector selected in processing step 350 is of the type of detector 180, the method 340 proceeds to 352. At 352, a cathode contact is applied to the surface having free (or more free) access to the gas during annealing, and anode contacts are applied to the surface having impeded access to the gas during annealing (e.g., the surface near the interface gap and blocking surface of 344). If the type of detector selected at 350 is of the type of detector 210, the method 340 proceeds to 354. At 354, a cathode is applied to the surface having impeded access to the gas during annealing, and anodes are applied to the surface having free (or more free) access to the gas during annealing. It may be again noted that the application of anodes and cathodes on the polished or etched surfaces of wafers may be performed using one or more of metal evaporation, metal spattering, electro-plating or electro-less plating.

As discussed herein, it should be noted that after the enhancement of the peaks of the electrical fields in one or more of the edge regions (e.g., regions $R_1$ and $R_3$) of the detectors, the electrical field in the intermediate region (or region $R_2$ of the depicted detectors) should preferably remain strong enough to ensure that, in region $R_2$, the drift time $t_e$ of the electron clouds is sufficiently shorter than the lifetime $\tau_e$ of the electrons. This aspect may be taken into account when controlling and adjusting the annealing diffusion process in order to produce an appropriate electrical field distribution profile in the bulk of the radiation detectors, regardless of whether the electrical field distribution is symmetric or asymmetric.

Figure 13:
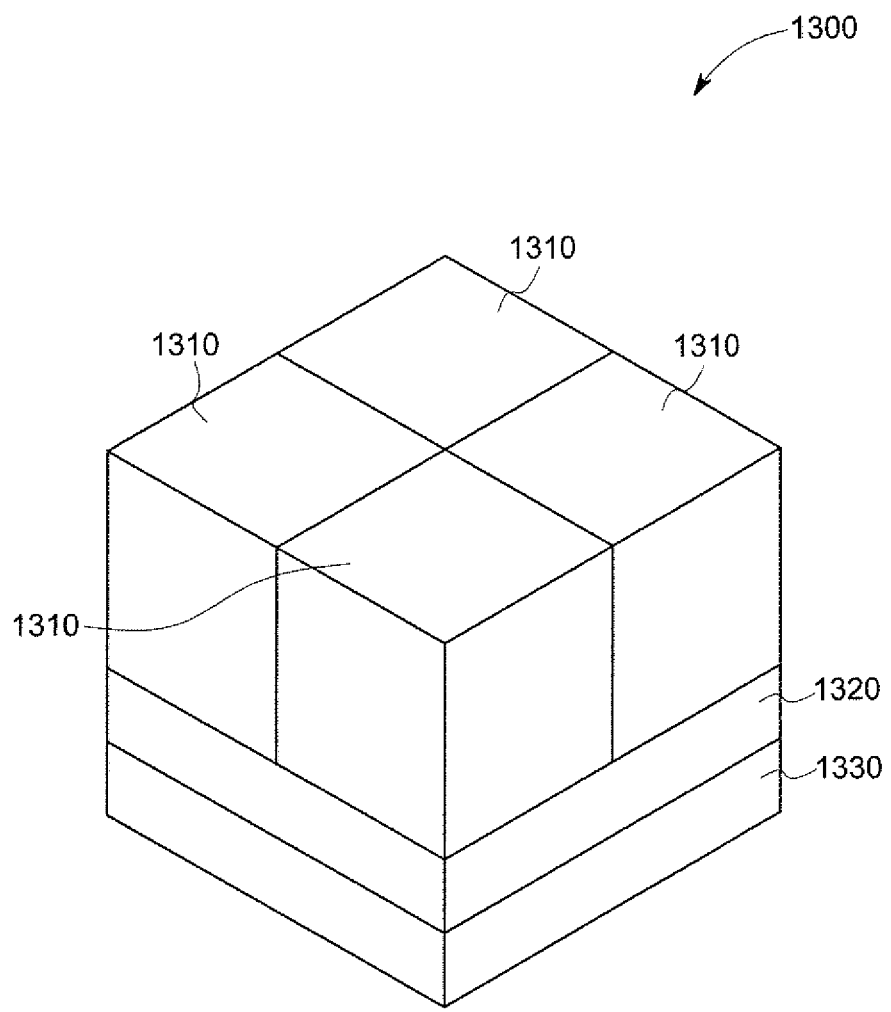
FIG. 13 is a schematic view of a radiation detector in accordance with various embodiments.

FIG. 13 provides a schematic block diagram of a detector assembly 1300 in accordance with an embodiment. The detector assembly 1300 includes processed wafers 1310 including cathodes and anodes contacts, analog front end (AFE) 1320, and digital readout board (DRB) 1330. A collimator (not shown) may be used in conjunction with the detector assembly 1300 to guide radiation to the detector assembly 1300. The wafers 1310, or tiles, may be configured as described herein. Plural wafers 1310 may be employed in the detector assembly 1300 in various embodiments. In the illustrated embodiment, four wafers 1310 are depicted; however, other numbers of wafers or tiles may be employed in various embodiments. The AFE 1320 is operably coupled to the wafers 1310, and the DRB 1330 is operably coupled to the AFE 1320. The AFE 1320 and/or DRB 1330 may be formed as part of a single unit with wafers 1310, or may be housed separately from the wafers 1310. For example, the AFE 1320 may be configured as a printed board directly attached to one or more wafers 1310. The DRB 1330 may be configured to provide digital outputs corresponding to information provided by AFE 1320. The information provided by the DRB 1330 may be used to reconstruct an image.

Figure 14:
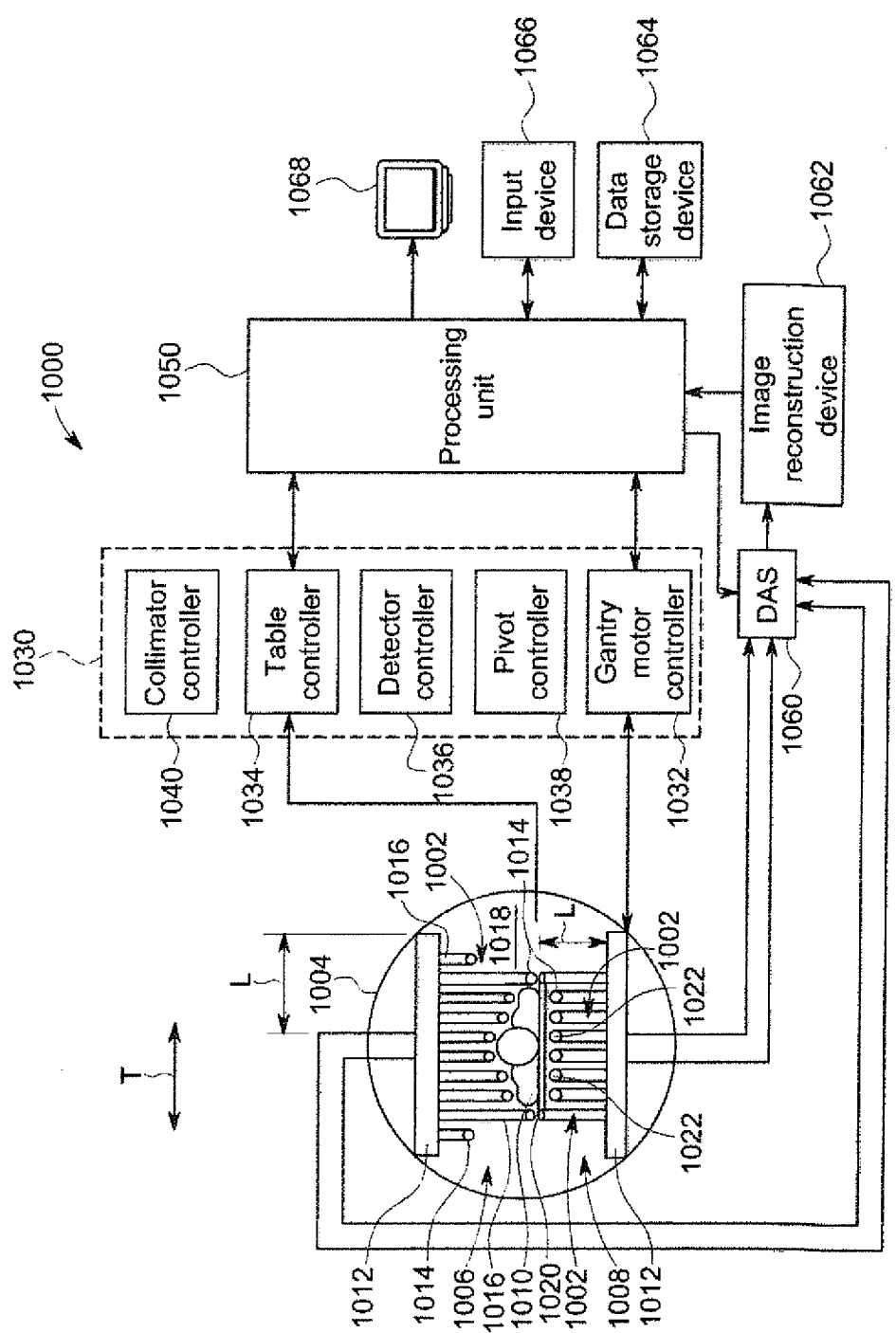
FIG. 14 is a schematic block diagram of a Nuclear Medicine (NM) imaging system in accordance with an embodiment.

FIG. 14 is a schematic illustration of a NM imaging system 1000 having a plurality of imaging detector head assemblies mounted on a gantry (which may be mounted, for example, in rows, in an iris shape, or other configurations, such as a configuration in which the movable detector carriers 1016 are aligned radially toward the patient-body 1010). In particular, a plurality of imaging detectors 1002 are mounted to a gantry 1004. In the illustrated embodiment, the imaging detectors 1002 are configured as two separate detector arrays 1006 and 1008 coupled to the gantry 1004 above and below a subject 1010 (e.g., a patient. The detector arrays 1006 and 1008 may be coupled directly to the gantry 1004, or may be coupled via support members 1012 to the gantry 1004 to allow movement of the entire arrays 1006 and/or 1008 relative to the gantry 1004 (e.g., transverse translating movement in the left or right direction as viewed by arrow T in FIG. 14). Additionally, each of the imaging detectors 1002 includes a detector unit 1014, at least some of which are mounted to a movable detector carrier 1016 (e.g., a support arm or actuator that may be driven by a motor to cause movement thereof) that extends from the gantry 1004. In some embodiments, the detector carriers 1016 allow movement of the detector units 1014 towards and away from the subject 1010, such as linearly. Thus, in the illustrated embodiment the detector arrays 1006 and 1008 are mounted in parallel above and below the subject 1010 and allow linear movement of the detector units 1014 in one direction (indicated by the arrow L), illustrated as perpendicular to the support member 1012 (that are coupled generally horizontally on the gantry 1004). However, other configurations and orientations are possible as described herein. It should be noted that the movable detector carrier 1016 may be any type of support that allows movement of the detector units 1014 relative to the support member 1012 and/or gantry 1004, which in various embodiments allows the detector units 1014 to move linearly towards and away from the support member 1012.

Each of the imaging detectors 1002 in various embodiments is smaller than a conventional whole body or general purpose imaging detector. A conventional imaging detector may be large enough to image most or all of a width of a patient's body at one time and may have a diameter or a larger dimension of approximately 50 cm or more. In contrast, each of the imaging detectors 1002 may include one or more detector units 1014 coupled to a respective detector carrier 1016 and having dimensions of, for example, 4 cm to 20 cm and may be formed of Cadmium Zinc Telluride (CZT) tiles or modules. However, it may be noted that different configurations and array sizes are contemplated including, for example, detector units 1014 having multiple rows of modules.

It should be understood that the imaging detectors 1002 may be different sizes and/or shapes with respect to each other, such as square, rectangular, circular or other shape. An actual field of view (FOV) of each of the imaging detectors 1002 may be directly proportional to the size and shape of the respective imaging detector.

The gantry 1004 may be formed with an aperture 1018 (e.g., opening or bore) therethrough as illustrated. A patient table 1020, such as a patient bed, is configured with a support mechanism (not shown) to support and carry the subject 1010 in one or more of a plurality of viewing positions within the aperture 1018 and relative to the imaging detectors 1002. Alternatively, the gantry 1004 may comprise a plurality of gantry segments (not shown), each of which may independently move a support member 1012 or one or more of the imaging detectors 1002.

The gantry 1004 may also be configured in other shapes, such as a "C", "H" and "L", for example, and may be rotatable about the subject 1010. For example, the gantry 1004 may be formed as a closed ring or circle, or as an open arc or arch which allows the subject 1010 to be easily accessed while imaging and facilitates loading and unloading of the subject 1010, as well as reducing claustrophobia in some subjects 1010.

Additional imaging detectors (not shown) may be positioned to form rows of detector arrays or an arc or ring around the subject 1010. By positioning multiple imaging detectors 1002 at multiple positions with respect to the subject 1010, such as along an imaging axis (e.g., head to toe direction of the subject 1010) image data specific for a larger FOV may be acquired more quickly.

Each of the imaging detectors 1002 has a radiation detection face, which is directed towards the subject 1010 or a region of interest within the subject.

The collimators 1022 (and detectors) in FIG. 14 are depicted for ease of illustration as single collimators in each detector head. However, it should be noted that the collimators 1022 may be configured in various arrangements in different embodiments. Optionally, for embodiments employing one or more parallel-hole collimators, multi-bore collimators may be constructed to be registered with pixels of the detector units 1014, which in one embodiment are CZT detectors. However, other materials may be used. Registered collimation may improve spatial resolution by forcing photons going through one bore to be collected primarily by one pixel. Additionally, registered collimation may improve sensitivity and energy response of pixelated detectors as detector area near the edges of a pixel or in-between two adjacent pixels may have reduced sensitivity or decreased energy resolution or other performance degradation. Having collimator septa directly above the edges of pixels reduces the chance of a photon impinging at these degraded-performance locations, without decreasing the overall probability of a photon passing through the collimator.

A controller unit 1030 may control the movement and positioning of the patient table 1020, imaging detectors 1002 (which may be configured as one or more arms), gantry 1004 and/or the collimators 1022 (that move with the imaging detectors 1002 in various embodiments, being coupled thereto). A range of motion before or during an acquisition, or between different image acquisitions, is set to maintain the actual FOV of each of the imaging detectors 1002 directed, for example, towards or "aimed at" a particular area or region of the subject 1010 or along the entire subject 1010. The motion may be a combined or complex motion in multiple directions simultaneously, concurrently, or sequentially as described in more detail herein.

The controller unit 1030 may have a gantry motor controller 1032, table controller 1034, detector controller 1036, pivot controller 1038, and collimator controller 1040. The controllers 1030, 1032, 1034, 1036, 1038, 1040 may be automatically commanded by a processing unit 1050, manually controlled by an operator, or a combination thereof. The gantry motor controller 1032 may move the imaging detectors 1002 with respect to the subject 1010, for example, individually, in segments or subsets, or simultaneously in a fixed relationship to one another. For example, in some embodiments, the gantry controller 1032 may cause the imaging detectors 1002 and/or support members 1012 to move relative to or rotate about the subject 1010, which may include motion of less than or up to 180 degrees (or more).

The table controller 1034 may move the patient table 1020 to position the subject 1010 relative to the imaging detectors 1002. The patient table 1020 may be moved in up-down directions, in-out directions, and right-left directions, for example. The detector controller 1036 may control movement of each of the imaging detectors 1002 to move together as a group or individually as described in more detail herein. The detector controller 1036 also may control movement of the imaging detectors 1002 in some embodiments to move closer to and farther from a surface of the subject 1010, such as by controlling translating movement of the detector carriers 1016 linearly towards or away from the subject 1010 (e.g., sliding or telescoping movement). Optionally, the detector controller 1036 may control movement of the detector carriers 1016 to allow movement of the detector array 1006 or 1008. For example, the detector controller 1036 may control lateral movement of the detector carriers 1016 illustrated by the T arrow (and shown as left and right as viewed in FIG. 14). In various embodiments, the detector controller 1036 may control the detector carriers 1016 or the support members 1012 to move in different lateral directions. Detector controller 1036 may control a swiveling motion of detectors 1002 together with their collimators 1022. In some embodiments, detectors 1002 and collimators 1022 may swivel or rotate around an axis.

The pivot controller 1038 may control pivoting or rotating movement of the detector units 1014 at ends of the detector carriers 1016 and/or pivoting or rotating movement of the detector carrier 1016. For example, one or more of the detector units 1014 or detector carriers 1016 may be rotated about at least one axis to view the subject 1010 from a plurality of angular orientations to acquire, for example, 3D image data in a 3D SPECT or 3D imaging mode of operation. The collimator controller 1040 may adjust a position of an adjustable collimator, such as a collimator with adjustable strips (or vanes) or adjustable pinhole(s).

It should be noted that motion of one or more imaging detectors 1002 may be in directions other than strictly axially or radially, and motions in several motion directions may be used in various embodiment. Therefore, the term "motion controller" may be used to indicate a collective name for all motion controllers. It should be noted that the various controllers may be combined, for example, the detector controller 1036 and pivot controller 1038 may be combined to provide the different movements described herein.

Prior to acquiring an image of the subject 1010 or a portion of the subject 1010, the imaging detectors 1002, gantry 1004, patient table 1020 and/or collimators 1022 may be adjusted, such as to first or initial imaging positions, as well as subsequent imaging positions. The imaging detectors 1002 may each be positioned to image a portion of the subject 1010. Alternatively, for example in a case of a small size subject 1010, one or more of the imaging detectors 1002 may not be used to acquire data, such as the imaging detectors 1002 at ends of the detector arrays 1006 and 1008, which as illustrated in FIG. 14 are in a retracted position away from the subject 1010. Positioning may be accomplished manually by the operator and/or automatically, which may include using, for example, image information such as other images acquired before the current acquisition, such as by another imaging modality such as X-ray Computed Tomography (CT), MRI, X-Ray, PET or ultrasound. In some embodiments, the additional information for positioning, such as the other images, may be acquired by the same system, such as in a hybrid system (e.g., a SPECT/CT system). Additionally, the detector units 1014 may be configured to acquire non-NM data, such as x-ray CT data. In some embodiments, a multi-modality imaging system may be provided, for example, to allow performing NM or SPECT imaging, as well as x-ray CT imaging, which may include a dual-modality or gantry design as described in more detail herein.

After the imaging detectors 1002, gantry 1004, patient table 1020, and/or collimators 1022 are positioned, one or more images, such as three-dimensional (3D) SPECT images are acquired using one or more of the imaging detectors 1002, which may include using a combined motion that reduces or minimizes spacing between detector units 1014. The image data acquired by each imaging detector 1002 may be combined and reconstructed into a composite image or 3D images in various embodiments.

In various embodiments, a data acquisition system (DAS) 1060 receives electrical signal data produced by the imaging detectors 1002 and converts this data into digital signals for subsequent processing. However, in various embodiments, digital signals are generated by the imaging detectors 1002. An image reconstruction device 1062 (which may be a processing device or computer) and a data storage device 1064 may be provided in addition to the processing unit 1050. It should be noted that one or more functions related to one or more of data acquisition, motion control, data processing and image reconstruction may be accomplished through hardware, software and/or by shared processing resources, which may be located within or near the imaging system 1000, or may be located remotely. Additionally, a user input device 1066 may be provided to receive user inputs (e.g., control commands), as well as a display 1068 for displaying images. DAS 1060 receives the acquired images from detectors 1002 together with the corresponding lateral, vertical, rotational and swiveling coordinates of gantry 1004, support members 1012, detector units 1014, detector carriers 1016, and detectors 1002 for accurate reconstruction of an image including 3D images and their slices.

It may be noted that the various methods described herein may employ structures or aspects of various embodiments (e.g., systems and/or methods) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In various embodiments, one or more steps from one depicted method may be used in connection or conjunction with one or more steps from one or more other depicted methods.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A radiation detector comprising:
   a cathode;
   an anode;
   a semiconductor wafer having opposed first and second surfaces, the first surface defining a first region proximate the first surface, the second surface defining a second region proximate the second surface, the first surface having the cathode mounted thereto and the second surface having the anode mounted thereto, the wafer configured to be biased by a voltage between the cathode and the anode to generate an electrical field in the semiconductor wafer and to generate electrical signals responsive to absorbed radiation, the semiconductor wafer comprising an annealed region and an un-annealed region, the annealed region having a higher resistivity than the un-annealed region, wherein the electrical field has an intensity having a first local maximum disposed at the first surface and a second local maximum disposed at the second surface, wherein the first local maximum and the second local maximum have a higher value than an electrical field intensity for an intermediate region interposed between the first region and the second region, wherein at least one of the first local maximum or the second local maximum of the electrical field occurs in the annealed region.

2. The radiation detector of claim 1, wherein the anode comprises plural pixelated anode contacts.

3. The radiation detector of claim 1, wherein the first and second local maximum have substantially similar values.

4. The radiation detector of claim 1, wherein the first and second local maximum have substantially different values.

5. The radiation detector of claim 1, wherein a drift time of the semiconductor wafer for electrons and holes traveling through the semiconductor wafer is shorter than a life time for the electrons and holes.

6. The radiation detector of claim 1, wherein the first local maximum is configured to cause holes traveling through the semiconductor to drift to the cathode within a time period that is shorter than a life time of the holes.

7. The radiation detector of claim 1, wherein the second local maximum is configured to cause electrons disposed proximate the second surface to induce a charge having a small pixel effect in the anode.

8. The radiation detector of claim 1, wherein the semiconductor wafer is comprised of Cadmium Telluride (CdTe).

9. The radiation detector of claim 1, wherein the semiconductor wafer is comprised of Cadmium Zinc Telluride (CZT).

10. The radiation detector of claim 1, wherein the radiation detector is configured to detect at least one of X-ray or Gamma Ray radiation.

11. The radiation detector of claim 1, wherein the radiation detector is configured for use with at least one of single photon emission tomography (SPECT), computed tomography (CT), or positron emission tomography (PET).

12. The radiation detector of claim 1, wherein one of the first local maximum or the second local maximum is at least 50% larger than the other of the first local maximum or the second local maximum.

13. The radiation detector of claim 1, wherein the electric field has a symmetric profile, and wherein the first local maximum and the second local maximum are within 5% of each other.

14. The radiation detector of claim 1, wherein the annealed region is formed by diffusion of a first element into the semiconductor wafer and diffusion of vacancies of a second element out from the semiconductor wafer, wherein the first element and the second element are different from each other and are each present in the radiation detector before forming the annealed region.

15. A radiation detector comprising:

a cathode;

an anode; and a semiconductor wafer having opposed first and second surfaces, the first surface having the cathode mounted thereto and the second surface having the anode mounted thereto, the wafer configured to be biased by a voltage between the cathode and the anode to generate an electrical field in the semiconductor wafer and to generate electrical signals responsive to absorbed radiation, wherein the electrical field has an intensity having at least one local maximum disposed proximate to a corresponding at least one of the first surface or second surface, wherein the at least one local maximum corresponds to an annealed region having higher resistivity than an un-annealed region, wherein the annealed region is formed by diffusion of a first element into the semiconductor wafer and diffusion of vacancies of a second element out from the semiconductor wafer, wherein the first element and the second element are different from each other and are each present in the radiation detector before forming the annealed region.

* * * * *